(12) United States Patent
Kang et al.

(10) Patent No.: US 11,048,304 B2
(45) Date of Patent: Jun. 29, 2021

(54) ELECTRONIC DEVICE COMPRISING ACCESSORY

(71) Applicant: Samsung Electronics Co., Ltd., Gyeonggi-do (KR)

(72) Inventors: Nam-Hyun Kang, Seoul (KR); Han Kim, Gyeonggi-do (KR); Ik-Sang Kim, Seoul (KR); Seon-Keun Park, Seoul (KR); Ji-Su Hwang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/612,892

(22) PCT Filed: May 21, 2018

(86) PCT No.: PCT/KR2018/005776
§ 371 (c)(1),
(2) Date: Nov. 12, 2019

(87) PCT Pub. No.: WO2018/216981
PCT Pub. Date: Nov. 29, 2018

(65) Prior Publication Data
US 2020/0166973 A1    May 28, 2020

(30) Foreign Application Priority Data

May 22, 2017  (KR) .................. 10-2017-0063153

(51) Int. Cl.
*G06F 1/16* (2006.01)
*H04B 5/02* (2006.01)
(Continued)

(52) U.S. Cl.
CPC ............. *G06F 1/1656* (2013.01); *H04B 5/02* (2013.01); *H05K 5/03* (2013.01); *H05K 9/0049* (2013.01)

(58) Field of Classification Search
CPC ........... G06F 1/1656; G06F 2200/1633; G06F 1/1681; G06F 1/1632; G06F 1/1669;
(Continued)

(56) References Cited

U.S. PATENT DOCUMENTS 8,344,836 B2 *  1/2013  Lauder .................. H01F 7/0205
                                                          335/219
8,498,100 B1 *  7/2013  Whitt, III .............. G06F 3/0219
                                                          361/679.17
(Continued)

FOREIGN PATENT DOCUMENTS

KR    10-2015-0110244 A    10/2015
KR    10-2015-0113218 A    10/2015
(Continued)

OTHER PUBLICATIONS

European Search Report dated May 12, 2020.

*Primary Examiner* — Hung S. Bui
*Assistant Examiner* — Sagar Shrestha
(74) *Attorney, Agent, or Firm* — Cha & Reiter, LLC

(57) ABSTRACT

Various embodiments relating to an electronic device comprising an accessory are described. An electronic device according to one embodiment comprises: a first electronic device forming a first curved surface on at least one side and including at least one first magnet on the first curved surface; a second electronic device forming a second curved surface on at least one side and including at least one second magnet on the second curved surface; and an accessory structure including third and fourth curved surfaces facing the first and second curved surfaces, and including at least one third and fourth magnets on the third and fourth curved surfaces, wherein the accessory structure may attach and detach the at least one first and second magnets and the at least one third and fourth magnets by magnetic force, may rotate the first and second curved surfaces along the third and fourth curved (Continued)

surfaces, and may be bent during rotation so as to mount the first electronic device at various angles. Other various embodiments are also possible.

19 Claims, 20 Drawing Sheets

(51) Int. Cl.
*H05K 5/03* (2006.01)
*H05K 9/00* (2006.01)

(58) Field of Classification Search
CPC .......... G06F 1/1679; G06F 1/16; H04B 5/02; H05K 5/03; H05K 9/0049
See application file for complete search history.

(56) References Cited

U.S. PATENT DOCUMENTS

| | | | |
|---|---|---|---|
| 8,878,637 B2 * | 11/2014 | Sartee | G06F 1/3265 335/219 |
| 9,372,511 B2 * | 6/2016 | Yeh | G06F 1/1669 |
| 9,774,136 B2 * | 9/2017 | Szeto | H01R 13/6205 |
| 9,778,705 B2 * | 10/2017 | Esmaeili | G06F 1/1684 |
| 10,063,009 B2 * | 8/2018 | Szeto | H01R 13/22 |
| 10,139,862 B1 * | 11/2018 | Nakamura | G06F 1/1669 |
| 2012/0066865 A1 | 3/2012 | Lauder et al. | |
| 2012/0194448 A1 * | 8/2012 | Rothkopf | B60R 11/0252 345/173 |
| 2013/0063873 A1 * | 3/2013 | Wodrich | H05K 7/00 361/679.01 |
| 2013/0242495 A1 * | 9/2013 | Bathiche | G06F 1/1679 361/679.28 |
| 2013/0301206 A1 * | 11/2013 | Whitt, III | G05B 11/01 361/679.28 |
| 2014/0049911 A1 * | 2/2014 | Corbin | A63B 71/0622 361/679.58 |
| 2014/0062629 A1 * | 3/2014 | Ow | H05K 9/0075 335/285 |
| 2014/0204511 A1 * | 7/2014 | Oh | G06F 1/1632 361/679.01 |
| 2014/0211393 A1 * | 7/2014 | Lee | G06F 1/1626 361/679.12 |
| 2015/0263776 A1 * | 9/2015 | Shyu | A45C 13/002 455/575.8 |
| 2015/0280768 A1 * | 10/2015 | Huang | H04B 1/3888 455/575.8 |
| 2015/0365123 A1 * | 12/2015 | Kim | H04B 1/3888 455/575.8 |
| 2016/0091927 A1 | 3/2016 | Tzou et al. | |
| 2016/0105204 A1 * | 4/2016 | Ko | G06F 1/1628 455/575.8 |
| 2016/0282955 A1 * | 9/2016 | Ko | G06F 3/0202 |
| 2017/0012662 A1 | 1/2017 | Balaji et al. | |
| 2017/0017273 A1 | 1/2017 | Weldon et al. | |
| 2017/0068276 A1 | 3/2017 | Wagman et al. | |
| 2017/0068281 A1 * | 3/2017 | Smith | G06F 1/1656 |
| 2017/0068286 A1 * | 3/2017 | Esmaeili | G06F 1/1626 |
| 2017/0125144 A1 * | 5/2017 | Lauder | G06F 1/1601 |
| 2017/0192455 A1 * | 7/2017 | Kim | G06F 1/1669 |
| 2017/0257146 A1 * | 9/2017 | Szeto | H02J 50/10 |
| 2017/0310042 A1 * | 10/2017 | Michelmann | H01R 13/6205 |
| 2018/0356864 A1 * | 12/2018 | Lee | G06F 1/1681 |
| 2018/0364769 A1 * | 12/2018 | Esmaeili | H01R 13/2407 |
| 2019/0004764 A1 * | 1/2019 | Son | G06F 1/1601 |
| 2019/0025889 A1 * | 1/2019 | Szeto | G06F 3/04886 |
| 2019/0235584 A1 * | 8/2019 | Tenno | H02J 50/10 |

FOREIGN PATENT DOCUMENTS

| | | |
|---|---|---|
| KR | 10-2016-0113680 A | 9/2016 |
| WO | 2014/035638 A1 | 3/2014 |

* cited by examiner

ELECTRONIC DEVICE COMPRISING ACCESSORY

CROSS REFERENCE TO RELATED APPLICATIONS

This application is a National Phase Entry of PCT International Application No. PCT/KR2018/005776, which was filed on May 21, 2018, and claims a priority to Korean Patent Application No. 10-2017-0063153, which was filed on May 22, 2017, the contents of which are incorporated herein by reference.

TECHNICAL FIELD

Various embodiments of the disclosure relate to an accessory attachable to/detachable from an electronic device, and an electronic device including the accessory.

BACKGROUND ART

Recently, various electronic devices, such as a portable phone, an MP3 player, a portable multimedia player (PMP), a smartphone, a tablet PC, and an electronic book terminal, have been provided to users, and the users are capable of accessing various contents while carrying the electronic devices.

With the rapid development of information and communication technology, the electronic devices have come to provide various functions such as music and video playback, game, camera, schedule management, and dictionary functions in addition to the original functions thereof in order to meet various needs of users, and further provide a function of adding a variety of data retrieval applications and new applications.

In addition, the electronic devices are reduced in size and weight, so that a user is capable of carrying and using the electronic devices in his/her hand or in his/her pocket or bag while moving. However, there always exists a risk of damage to the electronic devices because the electronic devices are stored and carried as described above. Thus, in order to protect the electronic devices safely, the electronic devices are used in the state of being mounted in separate accessories.

The accessories may provide basic functions of safely storing the electronic device and protecting the electronic devices from external impacts or scratches. In recent years, as a lot of multimedia contents for electronic devices are continuously being produced, more and more users use electronic devices mainly for media consumption and thus mount the electronic devices on a desk or table in an erected state using an accessory when watching the electronic device, rather than holding the electronic devices with their hands. For example, in order to mount the accessory, the accessory may be used in the form in which the accessory is bent such that the covers thereof are supported by each other.

DETAILED DESCRIPTION OF THE INVENTION

Technical Problem

An accessory is provided with a mounting portion for coupling or detachably attaching the electronic device thereto, and a cover, which is bent to be used as a cradle, is provided at one end of the mounting portion. Thus, the accessory is heavy, thick, and voluminous. Further, it is cumbersome to couple or detachably attach the electronic device to the mounting portion.

Various embodiments of the disclosure may provide an accessory that can be easily attached to/detached from an electronic device, and an electronic including the same.

Various embodiments of the disclosure may provide an accessory capable of protecting an electronic device having a small thickness and size, and an electronic device including the same.

Technical Solution

According to various embodiments of the disclosure, an electronic device, which includes an accessory, may include: a first electronic device having a first curved face on at least one side face and including at least one first magnet in the first curved face; a second electronic device having a second curved face on at least one side face and including at least one second magnet in the second curved face; and an accessory structure including third and fourth curved faces facing the first and second curved faces, and including at least one third magnet and at least one fourth magnet in the third curved face and the fourth curved face, respectively. The accessory structure may allow the first electronic device to be mounted at various angles when the at least one first magnet and the at least one second magnet are attached to/detached from the at least one third magnet and the at least one fourth magnet of the first and second electronic devices by magnetic force and the first and second curved faces of the first and second electronic devices are rotated along the third and fourth curved faces, and the accessory structure is bent by the rotation.

According to various embodiments of the disclosure, an accessory may include: a cover part including a first curved face and configured to cover at least one face of an electronic device; and at least one first magnet included in the first curved face of the cover part, the first magnet including a first portion configured to generate magnetic force and a shield member configured to block the magnetic force of the first portion. The first magnet may include the first portion configured to generate magnetic force and a second portion configured to block the magnetic force of the first magnet.

According to various embodiments of the disclosure, an electronic device, which includes an accessory, may include: a first electronic device having a first curved face on at least one side face and including at least one first magnet in the first curved face; and an accessory structure including a second curved face facing the first curved face and at least one second magnet in the second curved face. The accessory structure may allow the electronic device to be mounted at various angles when the at least one second magnet is attached to/detached from the at least one first magnet by magnetic force, the second curved face is rotated along the first curved face, and the accessory structure is bent during the rotation.

Advantageous Effects

According to various embodiments of the disclosure, the accessory includes at least one cover part attached to/detached from at least one electronic device and rotated in the attached state to allow the electronic device to be mounted at various angles using a magnet. Thus, the user is able to mount the electronic device at a desired angle. In addition, since it is possible to easily attach/detach each cover part to/from each electronic device, the use of the product can be facilitated, the thickness, volume, and weight of the product can be reduced, and the appearance design of the product can be enhanced.

MODE FOR CARRYING OUT THE INVENTION

Figure 1:
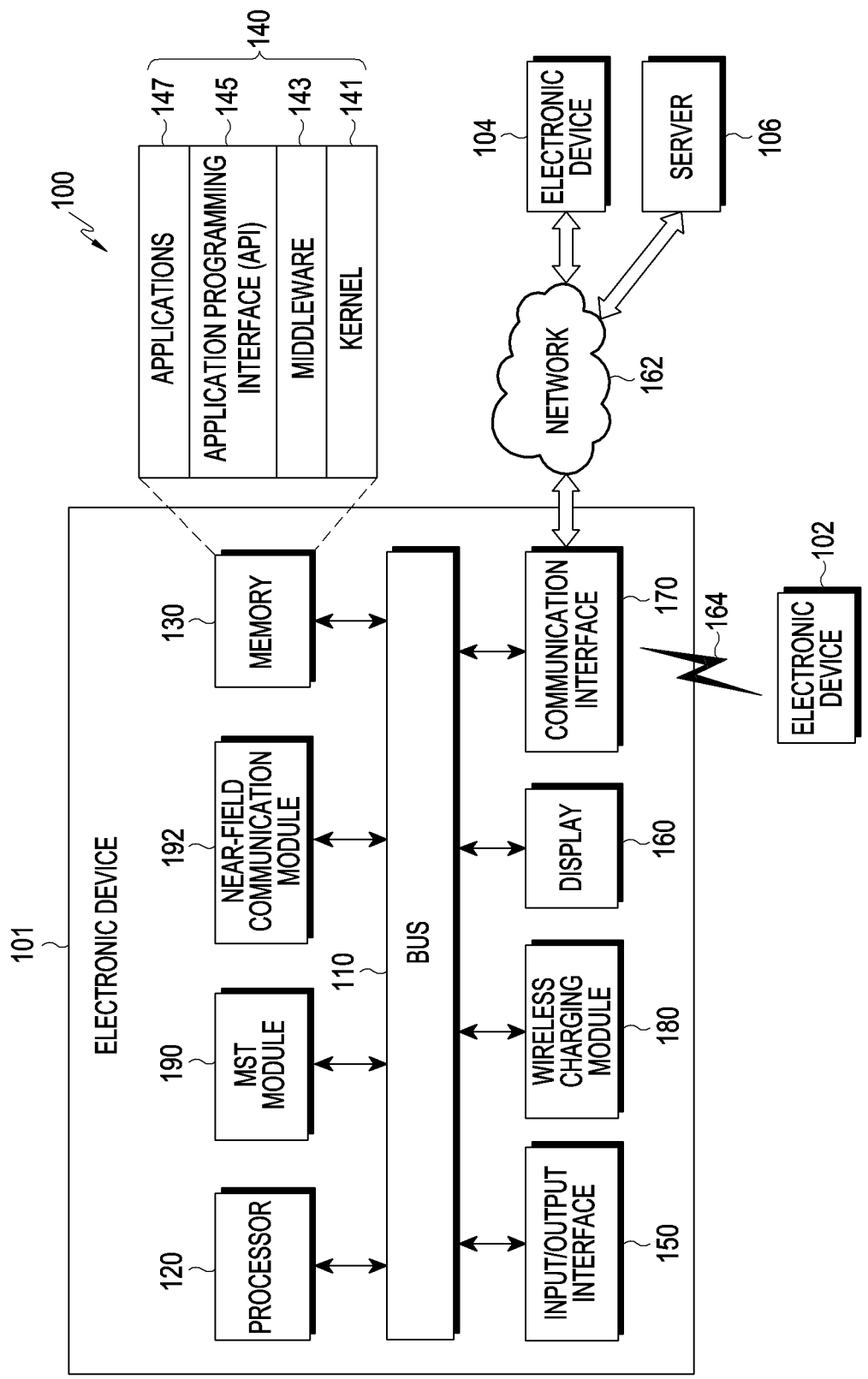
FIG. 1 is a block diagram illustrating a network environment that includes an electronic device according to various embodiments of the disclosure.

Hereinafter, various embodiments will be described with reference to the accompanying drawings. The embodiments and the terms used therein are not intended to limit the technology disclosed herein to specific forms, and should be understood to include various modifications, equivalents, and/or alternatives to the corresponding embodiments. In describing the drawings, similar reference numerals may be used to designate similar constituent elements. A singular expression may include a plural expression unless they are definitely different in a context. As used herein, the expression "A or B" or "at least one of A and/or B" may include all possible combinations of items enumerated together. The expression "a first", "a second", "the first", or "the second" may modify various elements regardless of the order and/or the importance, and is used merely to distinguish one element from another element without limiting the corresponding elements. When an element (e.g., first element) is referred to as being "(functionally or communicatively) connected," or "directly coupled" to another element (second element), the element may be connected directly to the another element or connected to the another element through yet another element (e.g., third element).

The expression "configured to" as used in various embodiments may be interchangeably used with, for example, "suitable for", "having the capacity to", "adapted to", "made to", "capable of", or "designed to" in terms of hardware or software, according to circumstances. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., Central Processing Unit (CPU) or Application Processor (AP)) that can perform the corresponding operations by executing one or more software programs stored in a memory device.

An electronic device according to various embodiments may include at least one of, for example, a smartphone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), an MPEG-1 audio layer-3 (MP3) player, a mobile medical device, a camera, or a wearable device. According to various embodiments, the wearable device may include at least one of an accessory type (e.g., a watch, a ring, a bracelet, an anklet, a necklace, a pair of glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit). In some embodiments, the electronic device may include at least one of, for example, a television, a Digital Video Disk (DVD) player, an audio player, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

In other embodiments, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Device, an electronic device for a ship (e.g., a navigation device for a ship and a gyrocompass), avionics, security devices, an automotive head unit, a robot for home or industry, an Automatic Teller's Machine (ATM) in banks, Point Of Sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.). According to some embodiments, an electronic device may include at least one of a part of furniture or a building/structure, an electronic board, an electronic signature receiving device, a projector, and various types of measuring instruments (e.g., a water meter, an electric meter, a gas meter, a radio wave meter, and the like). In various embodiments, the electronic device may be flexible, or may be a combination of one or more of the aforementioned various devices. According to an embodiment, the electronic devices are not limited to those described above. In the disclosure, the term "user" may indicate a person using an electronic device or a device (e.g., an artificial intelligence electronic device) using an electronic device.

An electronic device 101 according to various embodiments within a network environment 100 will be described with reference to FIG. 1. The electronic device 101 may include a bus 110, a processor 120, memory 130, an input/output interface 150, a display 160, and a communication interface 170. In some embodiments, at least one of the above-mentioned components may be omitted from the electronic device 101, or the electronic device 101 may additionally include other components. The bus 110 may include a circuit that interconnects the above-mentioned components 110 to 170 and transfers communication information (e.g., a control message or data) between the components 110 to 170. The processor 120 may include one or more of a central processing unit, an application processor (AP), and a communication processor (CP). The processor 120 may execute, for example, an arithmetic operation or data processing that is related to the control and/or communication of one or more other components of the electronic device 101.

The memory 130 may include volatile memory or non-volatile memory. The memory 130 may store, for example, instructions or data that are related to one or more other components of the electronic device 101. According to an embodiment, the memory 130 may store software or a program 140. The program 140 may include, for example, kernel 141, middleware 143, an application programming interface (API) 145, or an application program ("application") 147. At least one of the kernel 141, the middleware 143, and the API 145 may be referred to as an operating system (OS). The kernel 141 may control or manage, for example, system resources (e.g., the bus 110, the processor 120, and the memory 130) that are used for executing operations or functions implemented in the other programs (e.g., the middleware 143, the API 145, or the application 147). In addition, the kernel 141 may provide an interface that allows the middleware 143, the API 145, or the application 147 to access individual components of the electronic device 101 so as to control or manage system resources.

The middleware 143 may play an intermediary role such that, for example, the API 145 or the application 147 is capable of communicating with the kernel 141 so as to exchange data. In addition, the middleware 143 may process one or more task requests which are received from the applications 147, according to priority. For example, the middleware 143 may assign priority to be capable of using system resources of the electronic device 101 (e.g., the bus 110, the processor 120, or the memory 130) to at least one of the applications 147, and may process the one or more task requests. The API 145 is, for example, an interface that allows the applications 147 to control functions provided from the kernel 141 or the middleware 143, and may include, for example, one or more interfaces or functions (e.g., commands) for file control, window control, image processing, or character control. The input/output interface 150 may transmit commands or data, which are entered from, for example, a user or any other external device, to the other component(s) of the electronic device 101, or may output commands or data, which are received from the other component(s) of the electronic device 101, to the user or the other external device.

The display device 160 may include, for example, a liquid crystal display (LCD), a light-emitting diode (LED) display, an organic light-emitting diode (OLED) display, a microelectromechanical system (MEMS) display, or an electronic paper display. The display 160 may display various contents (e.g., text, image, video, icon, or symbol) to, for example, the user. The display 160 may include a touch screen, and may receive a touch input, a gesture input, a proximity input, or a hovering input that is made using, for example, an electronic pen or a part of the user's body. The communication interface 170 may set, for example, communication between the electronic device 101 and an external device (e.g., a first external electronic device 102, a second external device 104, or a server 106). For example, the communication interface 170 may be connected with a network 162 through wired or wireless communication so as to communicate with the external device (e.g., the second external electronic device 104 or the server 106).

The wireless communication may include a cellular communication that uses at least one of, for example, long-term evolution (LTE), LTE-advance (LTE-A), code division multiple access (CDMA), wideband CDMA (WCDMA), universal mobile telecommunication system (UMTS), wireless broadband (WiBro), and global system for mobile communication (GSM). According to one embodiment, as illustrated in FIG. 1, the wireless communication may include at least one of, for example, wireless fidelity (Wi-Fi), light fidelity (Li-Fi), Bluetooth, Bluetooth low energy (BLE), ZigBee, near-field communication (NFC), magnetic secure transmission (MST), radio frequency (RF), and body area network (BAN). According to one embodiment, the wireless communication may include GNSS. The GNSS may be, for example, a global positioning system (GPS), a global navigation satellite system (GLONASS), a BeiDou navigation satellite system (hereinafter, "Beidou"), Galileo, or the European global satellite-based navigation system. Herein, "GPS" may be used interchangeably with "GNSS" below. The wired communication may use at least one of, for example, universal serial bus (USB), high-definition multimedia interface (HDMI), recommended standard 232 (RS-232), power line communication, and plain old telephone service (POTS). The network 162 may include a telecommunication network (e.g., at least one of a computer network (e.g., LAN or WAN), the Internet, or a telephone network).

Each of the first and second external electronic devices 102 and 104 may be of a type, which is the same as or different from that of the electronic device 101. According to various embodiments, all or some of the operations to be executed by the electronic device 101 may be executed in another electronic device or a plurality of other electronic devices (e.g., the electronic devices 102 and 104 or the server 106). According to an embodiment, in the case where the electronic device 101 should perform certain functions or services automatically or in response to a request, the electronic device 101 may request some functions or services that are associated therewith from other electronic devices (e.g., the electronic devices 102 and 104 or the server 106), instead of, or in addition to, executing the functions or services by itself. The other electronic devices (e.g., the electronic devices 102 and 104 or the server 106) may execute the requested functions or additional functions, and may deliver the results to the electronic device 101. The electronic device 101 may provide the requested functions or services using the received results as they are or after additionally processing the received results. For this purpose, for example, cloud computing technology, a distributed computing technology, or client-server computing technology may be used.

The wireless charging module 180 may receive wireless power from a wireless power receiver or may transmit wireless power to another electronic device. The wireless charging module 180 may receive or transmit wireless power based on an inductive or resonant manner. The wireless charging module 180 may include a coil for transmitting/receiving wireless power.

The MST module 190 may be provided as an independent module separately from, for example, the communication interface 170. The MST module 190 can perform MST communication with other electronic devices. For example, the MST module 190 may emit electromagnetic fields having a magnitude that varies over time, in order to transmit signals containing information. The information may include information for wireless payment. The other electronic devices, e.g., a POS terminal, may receive signals containing information from the electronic device 101 by detecting a change over time in the magnitude of the electromagnetic field. Alternatively, the MST module 190 may include a coil for emission or detection of an electromagnetic field. The MST module 190 may receive signals from another electronic device by detecting a change over time in the electromagnetic field received from the other electronic device.

A near-field communication module 192 may include at least one of, for example, a cellular module, a Wi-Fi module, a Bluetooth module, a GNSS module, an NFC module, and an RF module. The near-field communication module may be provided, for example, as an independent module separately from a communication interface. According to an embodiment, the near-field communication module 192 may change the operating mode under the control of the processor 120. The processor may control the near-field communication module to transmit/receive data to/from an external electronic device.

Figure 2:
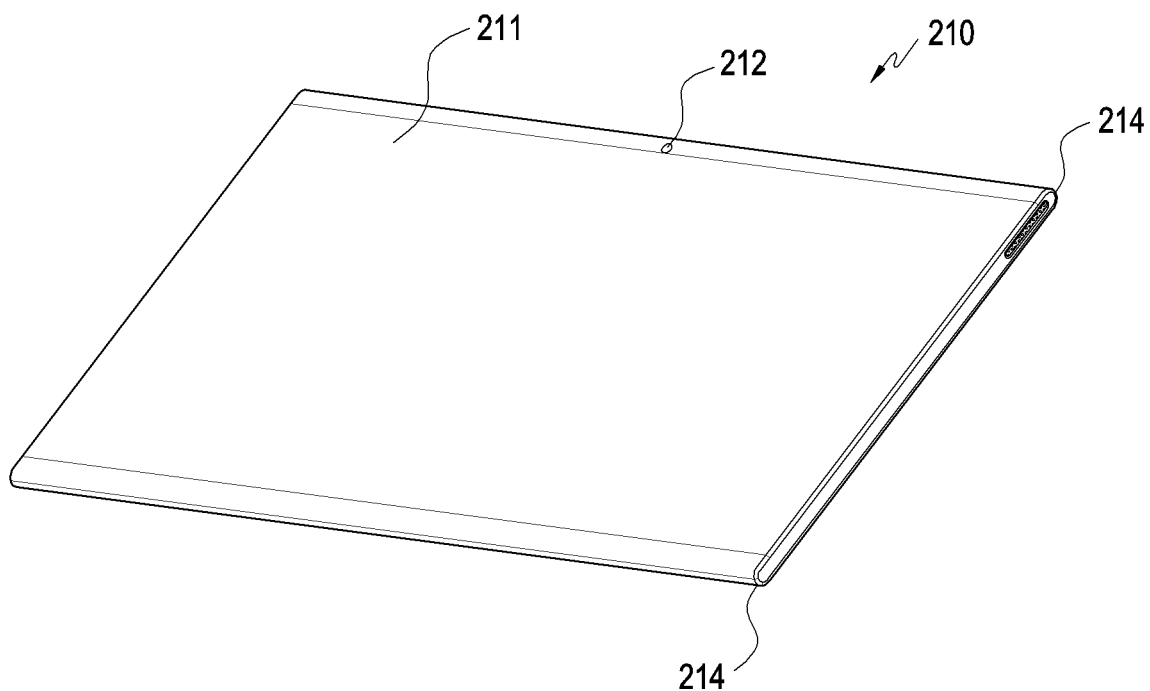
FIG. 2 is a perspective view illustrating the front face of a first electronic device according to various embodiments of the disclosure.
Figure 3:
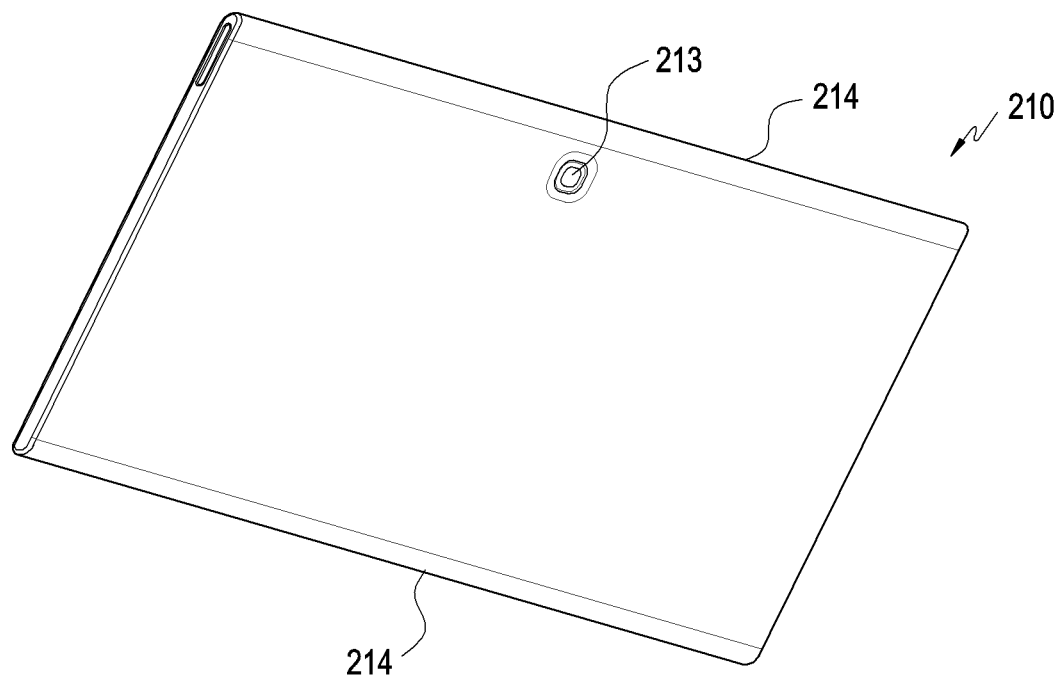
FIG. 3 is a perspective view illustrating the rear face of the first electronic device according to various embodiments of the disclosure.
Figure 4:
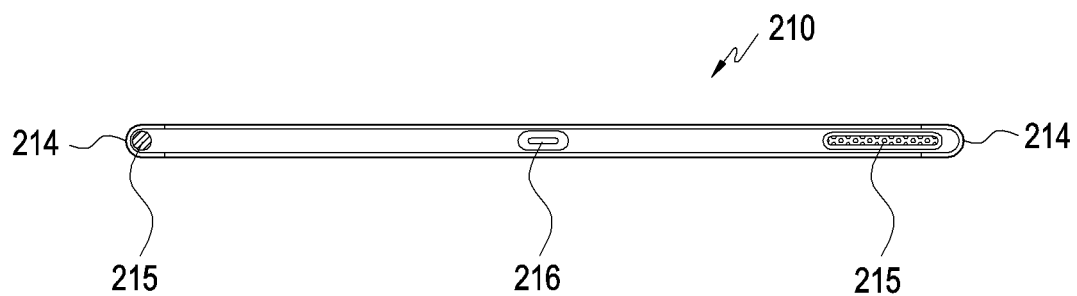
FIG. 4 is a cross-sectional view of the first electronic device according to various embodiments of the disclosure.

FIG. 2 is a perspective view illustrating the front face of a first electronic device according to various embodiments of the disclosure. FIG. 3 is a perspective view illustrating the rear face of the first electronic device according to various embodiments of the disclosure. FIG. 4 is a cross-sectional view of the first electronic device according to various embodiments of the disclosure.

Referring to FIG. 2, an electronic device (e.g., the electronic device 101 of FIG. 1) may further include first and second electronic devices 210 and 220. The first electronic device 210 may include a touch screen 211 disposed in the center of the front face thereof. The touch screen 211 may occupy a great portion of the front face of the first electronic device 210. For example, the touch screen 211 may display a main home screen and any home screen, which is different from the main home screen, or a menu screen. The main home screen may display a home key, a menu key, and a connection menu key.

According to various embodiments of the disclosure, a first camera 212, an illuminance sensor, a proximity sensor, or a speaker may be included in the upper end area of the front face of the first electronic device 210.

Referring to FIG. 3, a second camera 213, a flash 13b, or a speaker may be included in the rear face of the first electronic device 210. A battery pack may be embedded in the first electronic device 210. When the first electronic device 210 is configured such that the battery pack is detachable, the bottom face of the first electronic device 210 may be a detachable battery cover.

Referring to FIG. 4, a first curved face 214 may be formed on at least one side face of the first electronic device 210 and may include at least one first magnet 215 therein. The first electronic device 210 may include a mounting magnet 216 disposed in the center of thereof.

Figure 5A:
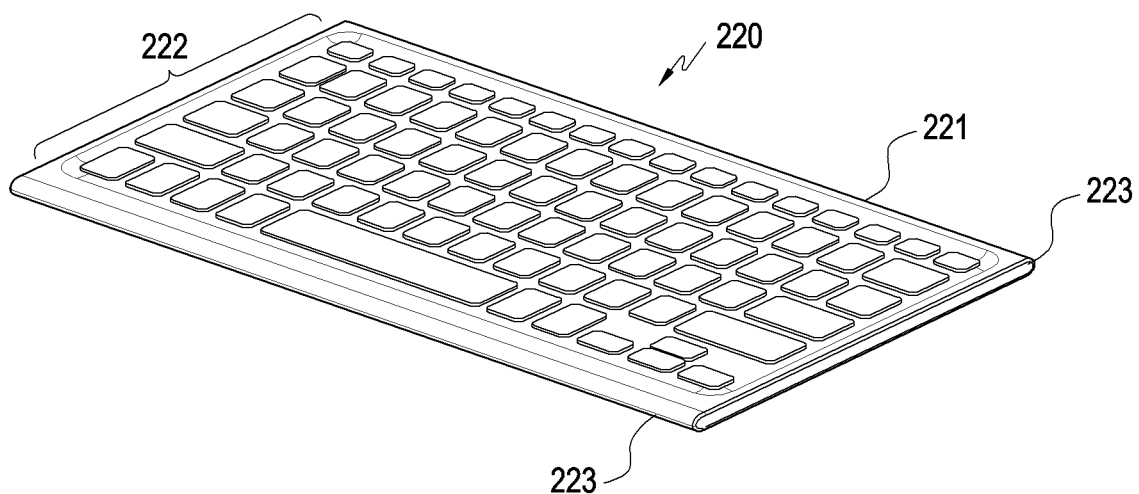
FIG. 5A is a perspective view illustrating a second electronic device according to various embodiments of the disclosure.
Figure 5B:
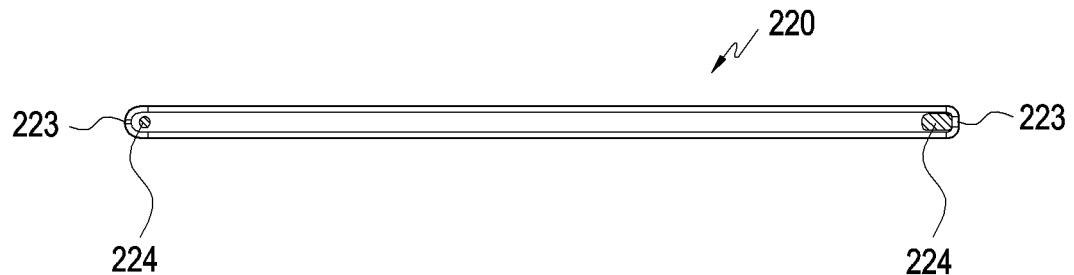
FIG. 5B is a cross-sectional view of the second electronic device according to various embodiments of the disclosure.

FIG. 5A is a perspective view illustrating the front face of a second electronic device according to various embodiments of the disclosure. FIG. 5B is a cross-sectional view illustrating at least one second magnet included in the second electronic device according to various embodiments of the disclosure.

Referring to FIG. 5A, the electronic device (e.g., the electronic device 101 in FIG. 1) may further include the first electronic device 210 and the second electronic device 220 (e.g., the second electronic device 220). The second electronic device 220 may include a keyboard 221 including a plurality of keys 222.

Referring to FIG. 5B, a second curved face 223 may be formed on at least one side face of the second electronic device 220 and may include at least one second magnet 224 therein.

Figure 6:
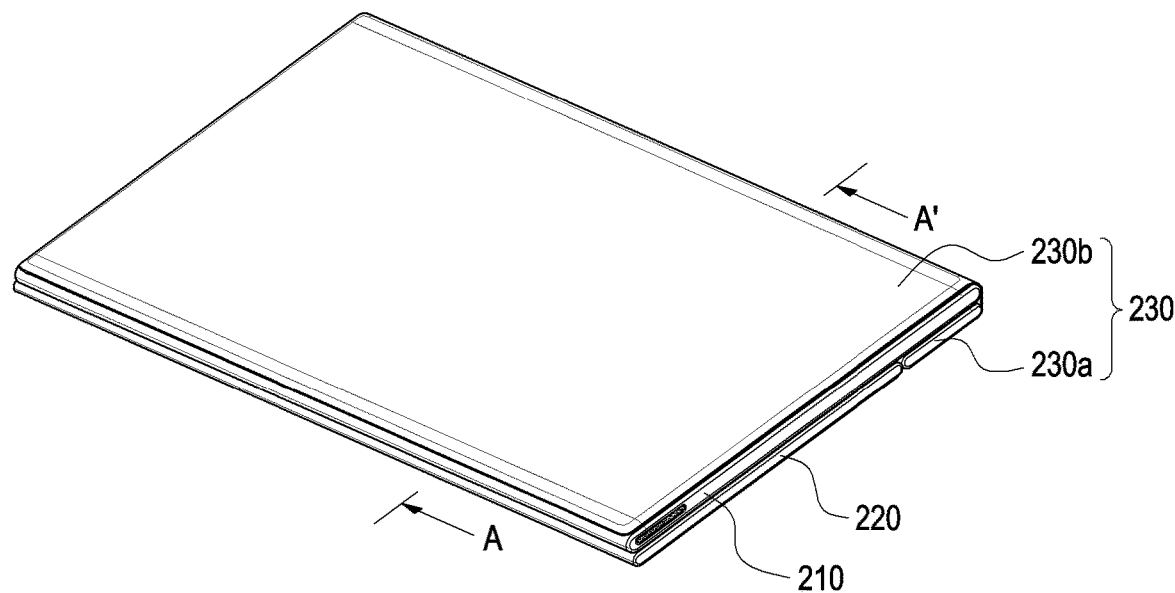
FIG. 6 is a perspective view illustrating the assembled state of an electronic device including an accessory according to various embodiments of the disclosure.
Figure 7:
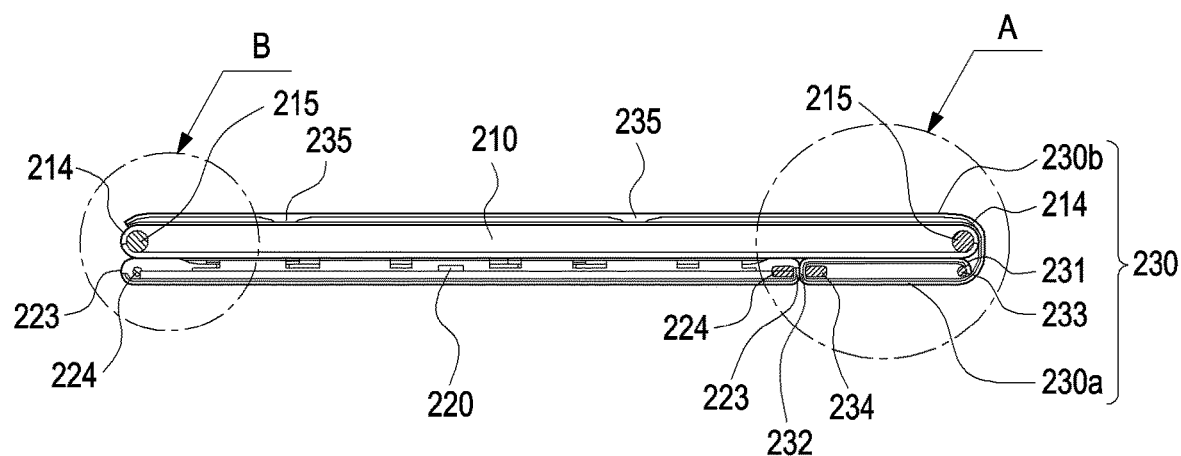
FIG. 7 is a cross-sectional view taken along line A-A' in FIG. 6.
Figure 8A:
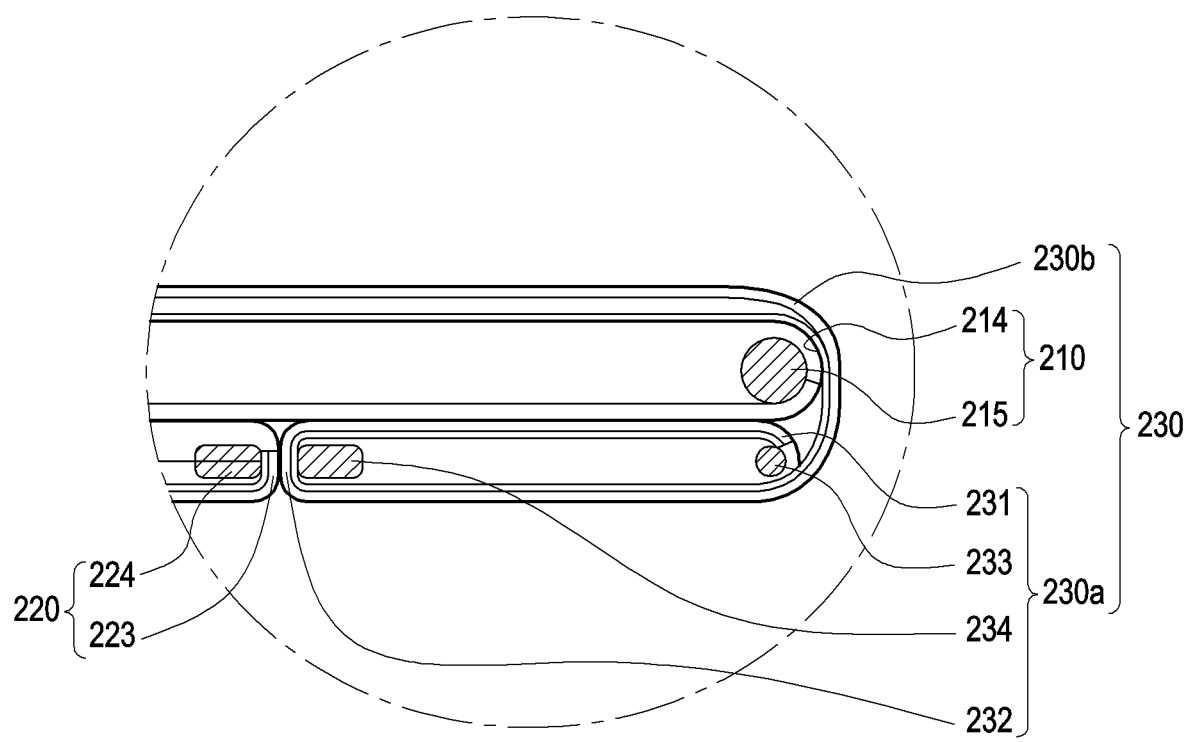
FIG. 8A is an enlarged cross-sectional view of the "A" portion in FIG. 7.
Figure 8B:
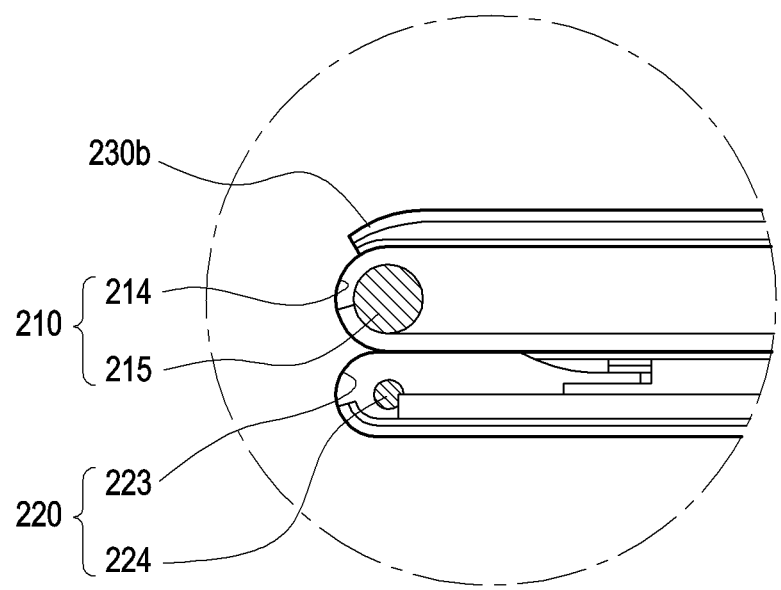
FIG. 8B is an enlarged cross-sectional view of the "B" portion in FIG. 7.

FIG. 6 is an exploded perspective view illustrating the assembled state of an electronic device including an accessory according to various embodiments of the disclosure, FIG. 7 is a cross-sectional view taken along line AA' in FIG. 6, in which the inner structure of the electronic device including the accessory is illustrated, FIG. 8A is an enlarged cross-sectional view of portion A in FIG. 7, and FIG. 8B is an enlarged cross-sectional view in portion B of FIG. 7.

Referring to FIGS. 6 and 7, the electronic device including an accessory (e.g., the electronic device 101 of FIG. 1) may include first and second electronic devices 210 and 220 and an accessory structure 230. According to an embodiment, the accessory structure 230 may include a protective cover that protects the first electronic device (e.g., the first electronic device 210 in FIG. 6) and the second electronic device (e.g., the second electronic device 220 in FIG. 6). The accessory structure 230 will be described with reference to a protective cover by way of example but is not limited thereto. That is, the accessory structure 230 is variously applicable as long as the accessory structure 230 covers the first and second electronic devices 210 and 220.

According to various embodiments of the disclosure, at least one side face of the first electronic device 210 may include a first curved face 214 formed to face third and fourth curved faces 231 and 232 of the accessory structure 230, which will be described later. The first curved face 214 may include at least one first magnet 215 to be attached to/detached from at least one third magnet 233 and at least one fourth magnet 234 included in the accessory structure 230, which will be described later. At least one side face of the first electronic device 220 may include a second curved face 223 formed to face third and fourth curved faces 231 and 232 of the accessory structure 230, which will be described later. The second curved face 223 may include at least one second magnet 224 to be attached to/detached from at least one third magnet 233 and at least one fourth magnet 234 included in the accessory structure 230, which will be described later. The accessory structure 230 may include third and fourth curved faces 231 and 232 to face the first and second curved faces 214 and 223 of the first and second electronic devices 210 and 220, and the third and fourth curved faces 231 and 232 may include at least one third magnet 233 and at least one fourth magnet 234 to be attached to/detached from the at least one first and second magnet 215 and at least one 224 of the first and second electronic devices 210 and 220 therein.

The accessory structure 230 described above allows the first electronic device 210 to be mounted at various angles when the at least one first magnet 215 and the at least one second magnet 224 are attached to/detached from the at least one third magnet 233 and the at least one fourth magnet 234 of the first and second electronic devices 210 and 220 by magnetic force, and the first and second curved faces 214 and 223 of the first and second electronic devices 210 and 220 are rotated along the third and fourth curved faces 231 and 232 such that the accessory structure 230 is bent during the rotation. Therefore, it is possible to easily attach/detach the first and second electronic devices 210 and 220 to/from the accessory structure 230, thereby facilitating the use of the product. Further, it is possible to freely adjust the mounting angle of the first electronic device 210, thereby facilitating the use of the accessory as well as improving the convenience of the user. By attaching/detaching or rotating the first and second electronic devices 210 and 220 using magnets, the separate mounting portion and hinge portion of a conventional electronic device (not illustrated) are not required, and thus it is possible to reduce the thickness, volume, and weight of the product and to design a product to have a beautiful appearance.

According to various embodiments of the disclosure, as illustrated in FIGS. 8A and 8B, the accessory structure 230 may include first and second cover parts 230a and 230b. The first cover part 230a may be located on at least a portion of the front face of the first electronic device 210, and a third curved face 231 may be formed at one side of the first cover part 230a to face the first curved face 214 of the first electronic device 210. The third curved face 231 may include therein at least one third magnet 233, which is attachable to/detachable from the at least one first magnet 215 of the first electronic device 210 by magnetic force so as to make the first curved face 214 of the first electronic device 210 rotatable along the third face 231 when rotated in the state in which the third magnet 233 is attached to the first magnet 215. At another side of the first cover part 230a may include a fourth curved face 232 formed to face the second face 223 of the second electronic device 220. The fourth curved face 232 may include therein at least one fourth magnet 234 to be attachable to/detachable from the at least one second magnet 224 of the second electronic device 220 by magnetic force and to make the second curved face 223 of the first electronic device 210 rotatable along the fourth curved face 232 when rotated in the state in which the fourth magnet 234 is attached to the second magnet 224.

The second cover part 230b is rotatably connected to the first cover part 230a, and when rotated, the second cover part 230b is capable of being bent to face at least a portion of the rear face of the first electronic device 210 and to be located behind the first electronic device 210, so that the first electronic device 210 can be mounted at various angles.

For example, when the second cover part 230b is used as a cradle, first, the second cover part 230b is rotatable from the first cover part 230a, and the first electronic device 210 is rotatable. At this time, the first curved face 214 of the first electronic device 210 is rotatable along the third curved face 231 of the first cover part 230a. That is, in the state in which the at least one first magnet 215 included in the first curved face 214 and the at least one third magnet 233 included in the third curved face 231 are attached to each other by magnetic force, the first curved face 214 of the first electronic device 210 is rotatable along the third curved face 231. In this state, since the second cover part 230b is provided with at least one bent portion 235 that allows the second cover part 230b to be bent, the second cover part 230b may be bent by the at least one bent portion 235 while being rotated, so that the second cover part 230b can be used as a cradle. At this time, the second cover part 230b may be attached to the at least one mounting magnet 216 included in the first electronic device 210 so that the use of the second cover part 220 as a cradle can be supported.

The first cover part 230a may include at least one of a speaker, a microphone, a camera, a connector terminal, a key button, and a touch screen. The speaker may include a thin film speaker.

Figure 9A:
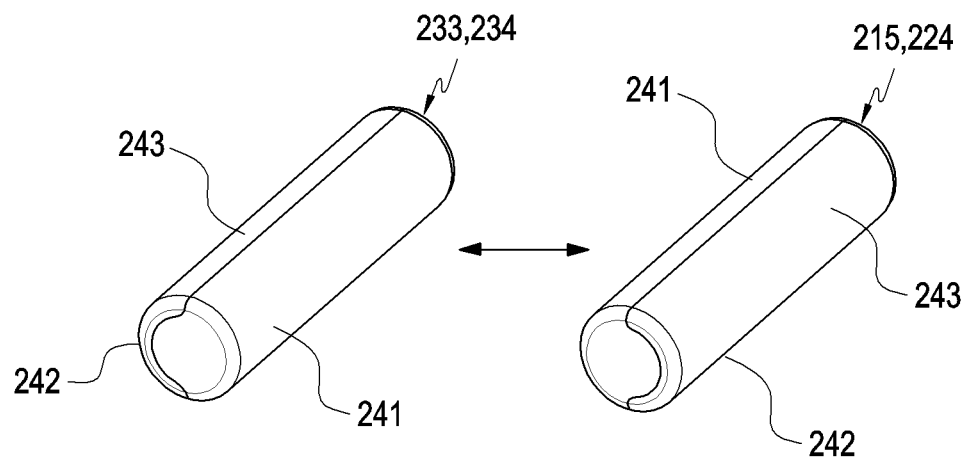
FIG. 9A is a perspective view illustrating the operating states of first, second, third, and fourth magnets in the configuration of an electronic device including an accessory according to various embodiments of the disclosure.
Figure 9B:
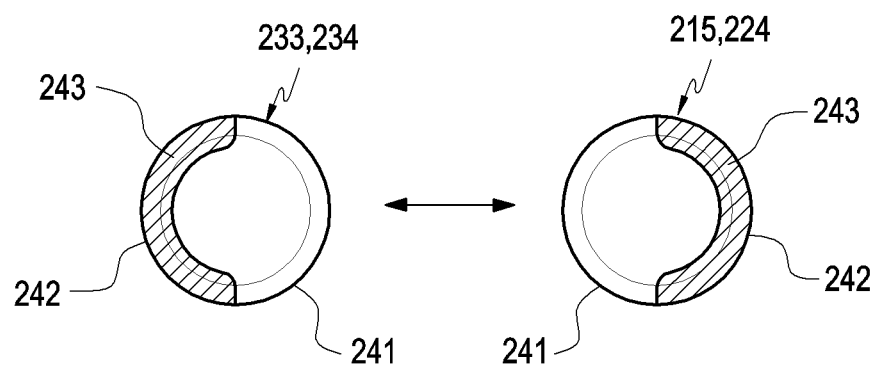
FIG. 9B is a cross-sectional view illustrating the operating states of the first, second, third, and fourth magnets in the configuration of the electronic device including an accessory according to various embodiments of the disclosure.

FIG. 9A illustrate perspective views illustrating the operating state of first, second, third, and fourth magnets in an electronic device including an accessory according to various embodiments of the disclosure, and FIG. 9B illustrates cross-sectional views illustrating the operating state of the first, second, third, and fourth magnets of the configuration of the electronic device including an accessory according to various embodiments of the disclosure.

Referring to FIGS. 9A and 9B, the first, second, third, and fourth magnets 215, 224, 233, and 234 may have a cylindrical bar shape. The first, second, third, and fourth magnets 215, 224, 233, and 234 may have any of various bar shapes with a curved cross section other than a cylindrical bar shape. For example, the first, second, third, and fourth magnets 215, 224, 233, and 234 may have a bar shape with an elliptical cross section.

The first portion 241 of each of the first, second, third, and fourth magnets 215, 224, 233, and 234 may generate magnetic force and a second portion 242 of each of the first, second, third, and fourth magnets 215 opposite the first portion 241 of each of the first, second, third, and fourth magnets 215, 224, 233, and 234 may include a shield member 243 to block the magnetic force of each magnet. According to an embodiment, the shield member 243 may include a hemisphere shape. According to another embodiment, the shield member 243 may have a shape other than the hemisphere shape. For example, a portion of the cylindrical bar may generate magnetic force, and the remaining portion of the cylindrical bar may include a shield member 243 that blocks the magnetic force.

The shield member 243 may include a metal material. In this embodiment, the shield member 243 will described with reference to a metal material by way of example but is not limited thereto. That is, various materials other than a metal material are applicable to the shield member 243 as long as the materials are capable of shielding the magnetic force of the magnet. For example, the shield member may be made of a synthetic resin material.

According to an embodiment, the first magnet 215 of the first electronic device 210 and the third magnet 233 of the first cover part 230a are attachable to/detachable from each other by magnetic force. That is, the first portions 241 of the first and third magnets 215 and 233, neither of which has a shield member 243, are attachable to/detachable from each other by magnetic force, and the shield members 243 included in the second portions 242 of the first and third magnets 215 and 233 opposite the first portions capable of shielding the magnetic force of the first and third magnets 215 and 233 and preventing the electronic components included in the first electronic device 210 from malfunctioning due to the magnetic force.

When the electronic device 210 is rotated in the state in which the first and third magnets 215 and 233 are attached to each other by magnetic force, the first curved face 214 of the first electronic device 210 is rotatable along the third curved face 231 of the first cover part 230a.

The second magnet 224 of the second electronic device 220 and the fourth magnet 234 of the first cover part 230a are attachable to/detachable from each other by magnetic force. That is, the first portions 241 of the second and fourth magnets 224 and 234, neither of which has a shield member 243, are attachable to/detachable from each other by magnetic force, and the shield members 243 included in the second portions 242 of the second and fourth magnets 224 and 234 opposite the first portions are capable of shielding the magnetic force of the second and fourth magnets 224 and 234 and preventing the electronic components included in the second electronic device 220 from malfunctioning due to the magnetic force.

Similarly, when the second electronic device 220 is rotated in the state in which the second and fourth magnets 224 and 234 are attached to each other by magnetic force, the second curved face 223 of the second electronic device 220 is rotatable along the fourth curved face 232 of the first cover part 230a.

Figure 10:
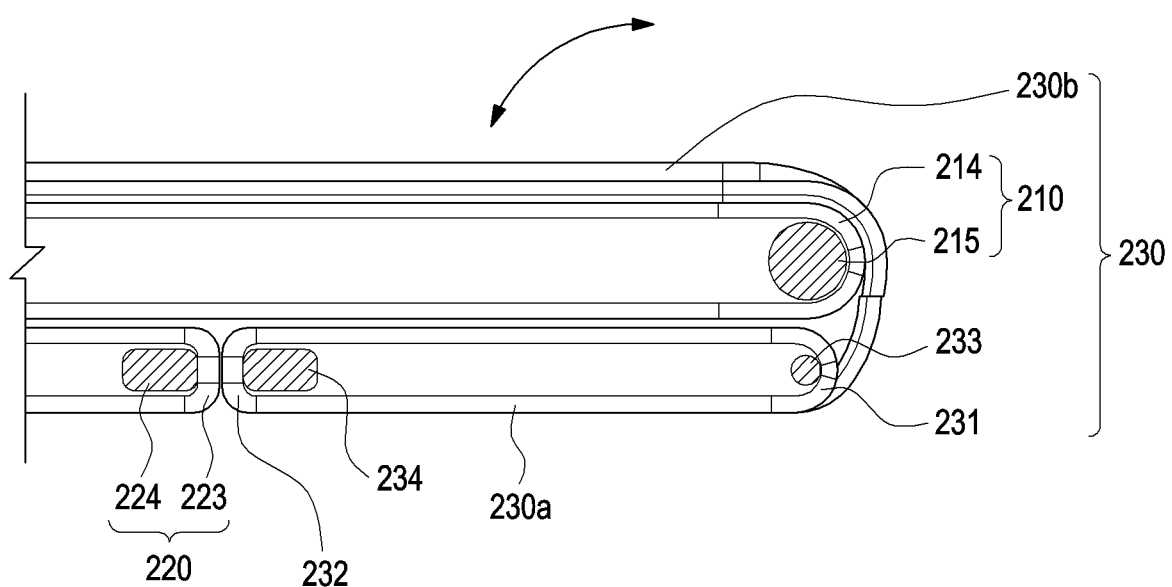
FIG. 10 is a perspective view illustrating the operating state of an electronic device including an accessory according to various embodiments of the disclosure.
Figure 11:
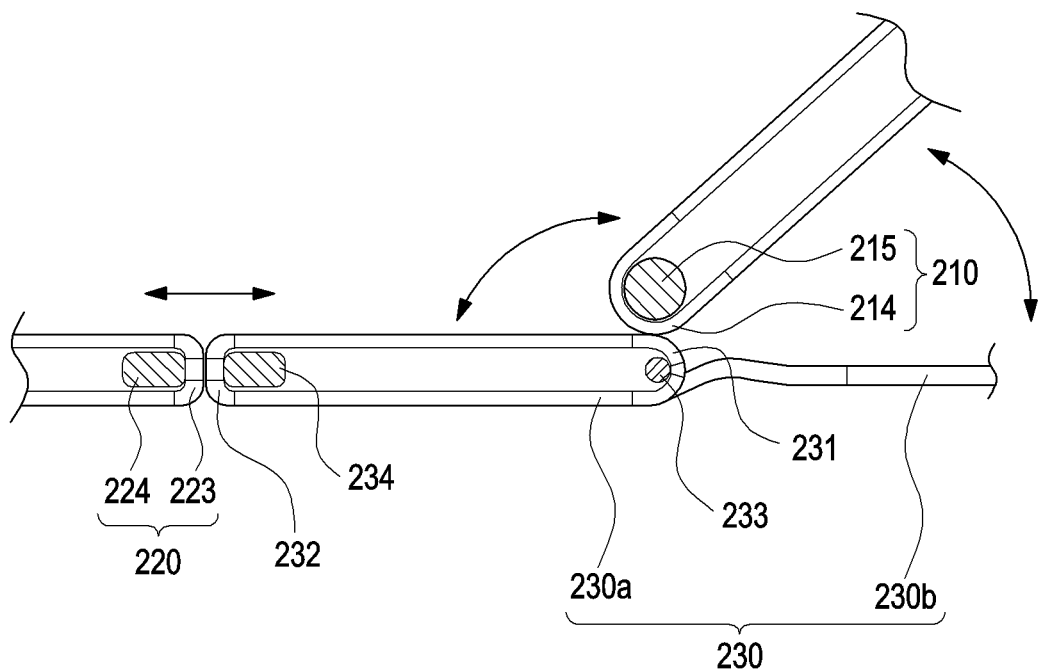
FIG. 11 is a cross-sectional view illustrating the operating state of the electronic device including an accessory according to various embodiments of the disclosure.
Figure 12:
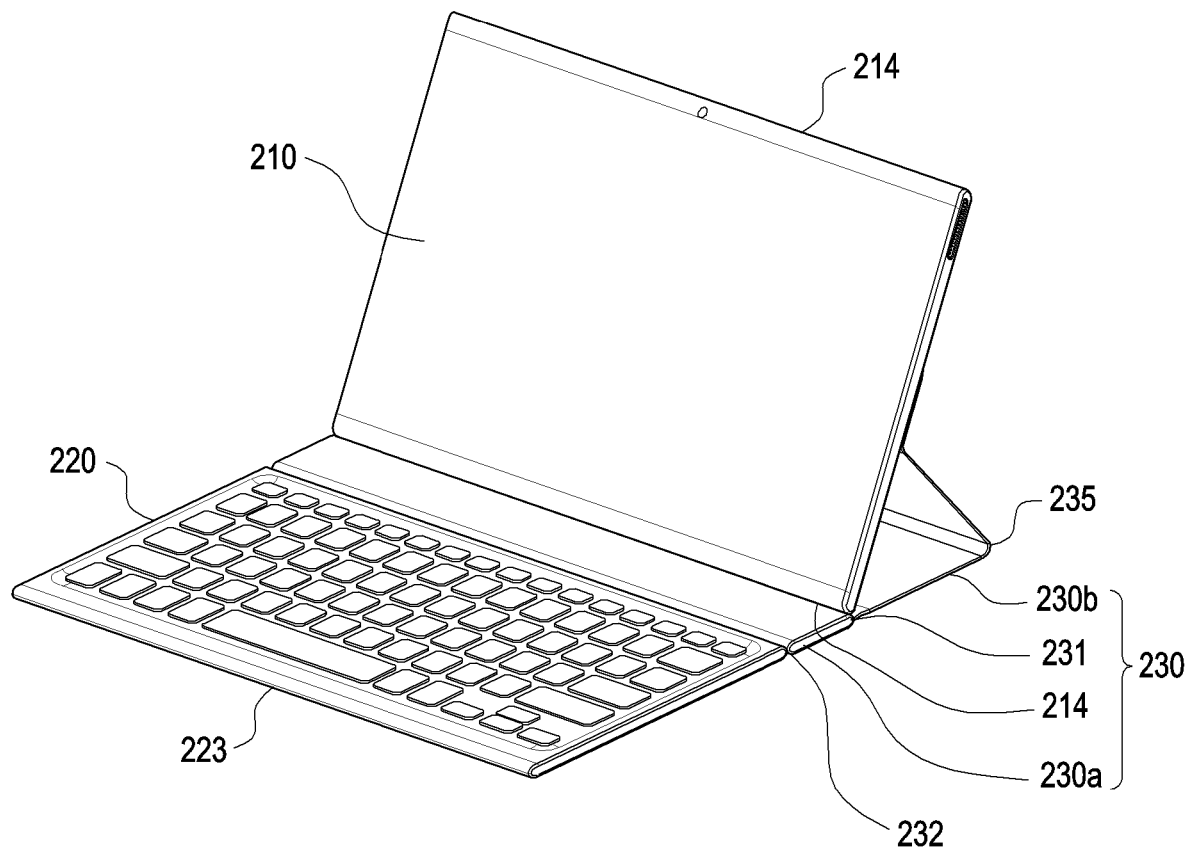
FIG. 12 is an enlarged cross-sectional view illustrating an electronic device including an accessory according to various embodiments prior to operation.
Figure 13:
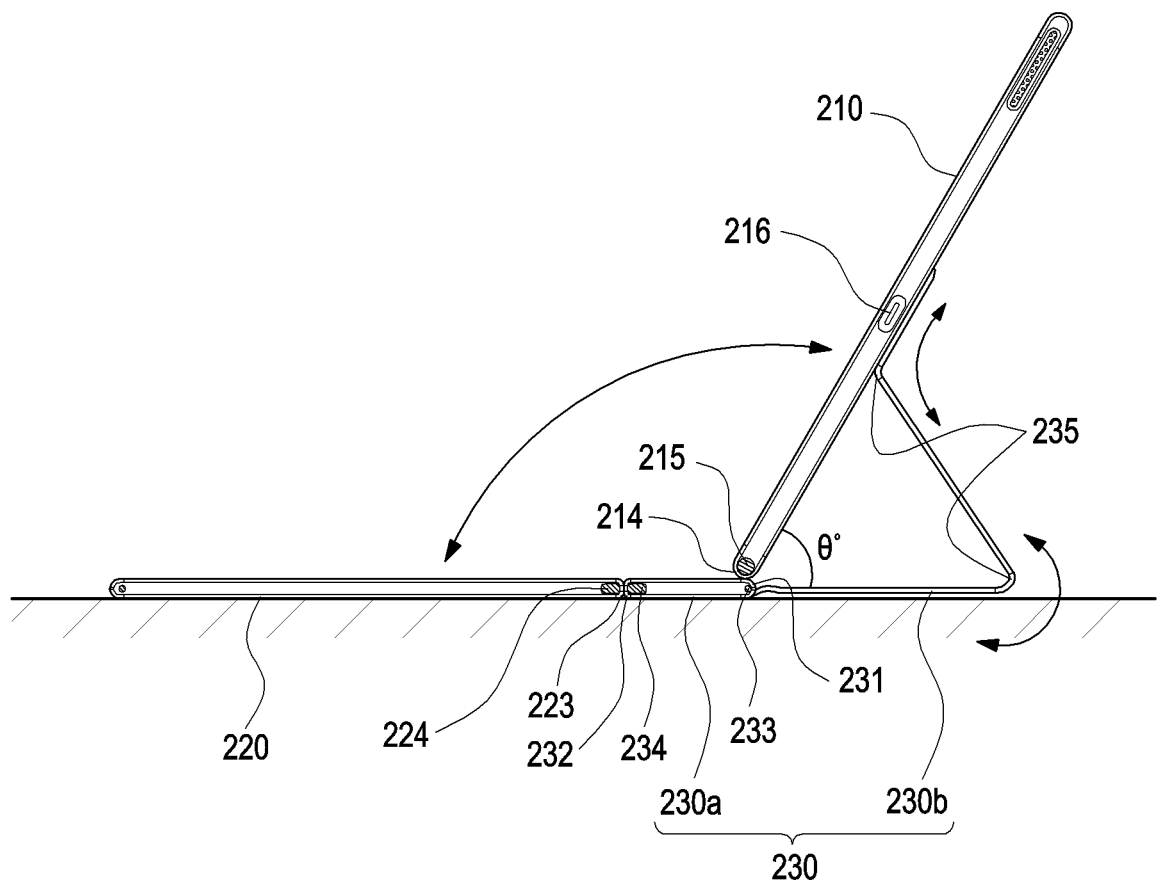
FIG. 13 is an enlarged cross-sectional view illustrating the operating state of the electronic device including an accessory according to various embodiments of the disclosure.

FIG. 10 is an enlarged cross-sectional view illustrating an electronic device including an accessory according to various embodiments of the disclosure prior to operation, FIG. 11 is an enlarged cross-sectional view illustrating the electronic device including the accessory according to various embodiments of the disclosure after operation, FIG. 12 is a perspective view illustrating the operating state of the electronic device including the accessory according to various embodiments of the disclosure, and FIG. 13 is a cross-sectional view illustrating the operating state of the electronic device including the accessory according to various embodiments of the disclosure.

Referring to FIGS. 10 and 11, the electronic device including an accessory (e.g., the electronic device 100 of FIG. 1, the electronic device 210 of FIG. 2, or the electronic device 220 in FIG. 5A) may include an accessory structure 230. The accessory structure 230 may include first and second cover parts 230a and 230b. For example, it is possible to make a first curved face 214 formed on one side surface of the first electronic device 210 face a third curved face 231 of the first cover part 230a, and it is possible to make a fourth curved face 232 of the first cover part 230a face a second curved face 223 formed on one side face of the second electronic device 220. At this time, a first magnet 215 included in the first curved face 214 is attachable to a third magnet 233 included in the third curved face 231 of the first cover part 230a by magnetic force, and the fourth magnet 234 included in the fourth curved face 232 of the first cover part 230a is attachable to the second magnet 224 included in the second curved face 223 by magnetic force.

Referring to FIGS. 12 and 13, when the second cover part 230b is used as a cradle, since the second cover part 230b located behind the first electronic device 210 is rotatable from the first cover part 230a, and the first magnet 215 of the first electronic device 210 and the third magnet 233 of the first cover part 230a are attached to each other by a magnetic force, the first electronic device 210 is rotatable from the first cover part 230a. At this time, the first curved face 214 of the first electronic device 210 is rotatable along the third curved face 231 of the first cover part 230a. In this state, the second cover part 230b is capable of being bent by at least one bent portion 235 included therein. At the same time, one end of the second cover part 230b is attachable to at least one mounting magnet 216 provided on the rear face of the first electronic device 210. As described above, by bending the second cover part 230b to be disposed behind the first electronic device 210 and to support the first electronic device 210, it is possible to use the second cover part 230b as a cradle. At this time, the fourth curved face 232 of the first cover part 230a is capable of facing the second curved face 223 of the second electronic device 220, and the fourth magnet 234 included in the fourth curved face 232 of the first cover part 230a is attachable to the second magnet 224 included in the second curved face 223 of the second electronic device 220 by magnetic force. The first electronic device 210 may be mounted to be inclined at a mounting angle θ of, for example, 60 degrees from the floor.

According to an embodiment, when the first and second cover parts 230a and 230b are used as a standing cradle or a typing cradle, the second cover part 230b is capable of being bent while being rotated, so that the second cover part 230b is capable of supporting the rear face of the first electronic device 210 so as to mount the first electronic device 210 in the standing state. The second electronic device 220 may be mounted such that typing can be performed thereon by attaching the fourth magnet 234 included in the fourth curved face 232 of the first cover portion 230a to the second magnet 224 included in the second curved face 223 of the second electronic device 220 by magnetic force and bringing the first cover part 230a into close contact with the floor.

According to an embodiment, the first electronic device 210 may be a tablet PC including a display unit on which an image is capable of being viewed, and the second electronic device 220 may be a keyboard on which typing is capable of being performed.

According to an embodiment, the first and second electronic devices 210 and 220 and the first cover part 230a may include a near-field communication module (e.g., the near-field communication module 192 in FIG. 1) such that the first and second electronic devices 210 and 220 and the first cover part 230a transmit and receive signals for near-field communication with each other.

The near-field communication module 192 (e.g., the near-field communication module 192 in FIG. 1) may include at least one of, for example, a cellular module, a Wi-Fi module, a Bluetooth module, a GNSS module, an NFC module, and an RF module. Various communication modules capable of near-field communication may be applicable as the near-field communication module (e.g., the near-field communication module 192 in FIG. 1) in addition to the disclosed module. In this embodiment, a Bluetooth module may be applicable as the near-field communication module (e.g., the near-field communication module 192 in FIG. 1).

The near-field communication module (e.g., the near-field communication module 192 in FIG. 1) may be provided, for example, as an independent module separately from a communication interface. According to an embodiment, the near-field communication module 192 (the near-field communication module 192 in FIG. 1) may change the operating mode under the control of a processor 120 (e.g., the processor 120 in FIG. 1). The processor 120 may control the near-field communication module (e.g., the near-field communication module 192 in FIG. 1) to transmit and receive data to and from the first and second electronic devices 210 and 220 and the first cover part 230a.

That is, the processor 120 may control the overall operation of the first and second electronic devices 210 and 220 and the first cover part 230a, and may perform control for the near-field communication function provided by the first and second electronic devices 210 and 220 and the first cover part 230a. The processor 120 is a device for driving an operating system (OS) and each component thereof. For example, the processor 120 may be a central processing unit (CPU).

The processor 120 according to various embodiments of the disclosure may control activate or deactivate the near-field communication function of the near-field communication module (e.g., the near-field communication module 192 in FIG. 1) depending on whether the near-field communication modules (e.g., the near-field communication module 192 in FIG. 1) of the first and second electronic devices 210 and 220 and the near-field communication module (e.g., the near-field communication module 192 in FIG. 1) of the first cover part 230a are connected to each other. When the near-field communication modules (e.g., the near-field communication module 192 in FIG. 1) of the first and second electronic devices 210 and 220 and the near-field communication module (e.g., the near-field communication module 192 of FIG. 1) of the first cover part 230a are connected to each other, the processor 120 activates the communication function of the near-field communication modules such that the near-field communication modules (e.g., the short-communication module 192 in FIG. 1) are in the communication state, and when the near-field communication modules (e.g., the short-range module 192 in FIG. 1) of the first and second electronic devices 210 and 220 and the near-field communication module (e.g., the near-field communication module 192 in FIG. 1) of the first cover part 230a are released from the connection in communication state (i.e., being in the disconnected state), the processor 120 deactivates the communication function of the near-field communication modules (e.g., the near-field communication modules (e.g., the near-field communication module 192 in FIG. 1)). This may be performed as follows: the processor (e.g., the processor 120 in FIG. 1) transmits activation/deactivation setting information on the near-field communication function to the near-field communication modules (e.g., the near-field communication module 192 in FIG. 1), and the near-field communication modules receiving the same (e.g., the near-field communication module 192 in FIG. 1) store the activation/deactivation setting information and perform or block the communication function depending on the stored setting information.

The processor 120 may activate/deactivate the near-field communication function of the near-field communication modules (e.g., the short-range-communication module 192 in FIG. 1) depending on on/off of the power supplies of the first and second electronic devices 210 and 220 and the first cover part 230a. For example, the processor 120 transmits deactivation setting information to the near-field communication modules (e.g., the near-field communication module 192 in FIG. 1) such that the communication modules (e.g., the near-field communication module 192 in FIG. 1) are changed from "whether to activate/deactivate" to "deactivation. Subsequently, the near-field communication modules (e.g., the near-field communication module 192 in FIG. 1) do not perform the near-field communication function since the setting information is changed to the deactivation.

In addition, the processor 120 transmits activation setting information to the near-field communication modules (e.g., the near-field communication module 192 in FIG. 1) such that the communication modules (e.g., the near-field communication module 192) are changed from "whether to activate/deactivate" to "activation". Subsequently, the near-field communication modules (e.g., the near-field communication module 192 in FIG. 1) are capable of performing the near-field communication function since the setting information is changed to the activation.

A communication interface provided in the processor 120 may perform data communication through a wireless communication network. In addition, the communication interface may perform data transmission/reception data using one or more communication methods, and for this purpose, the communication interface may include a plurality of communication interfaces, perform data transmission and reception based on different communication methods, respectively.

The memory 130 stores information necessary for the operation of the first and second electronic devices 210 and 220 according to an embodiment of the disclosure, and may store various data for the near-field communication function.

According to an embodiment, when the at least one first magnet 215 of the first electronic device 210 and the at least one third magnet 233 of the accessory are attached to or detached from each other by magnetic force, the first electronic device 210 may perform an input mode or an operation mode, and when the at least one second magnet 224 of the second electronic device 220 and the at least one fourth magnet 234 of the accessory structure are attached to or detached from each other by magnetic force, the second electronic device 220 may perform an input mode or an operation mode.

Hereinafter, other operation processes of the electronic device including the accessory according to various embodiments of the disclosure will be described in more detail.

Figure 14:
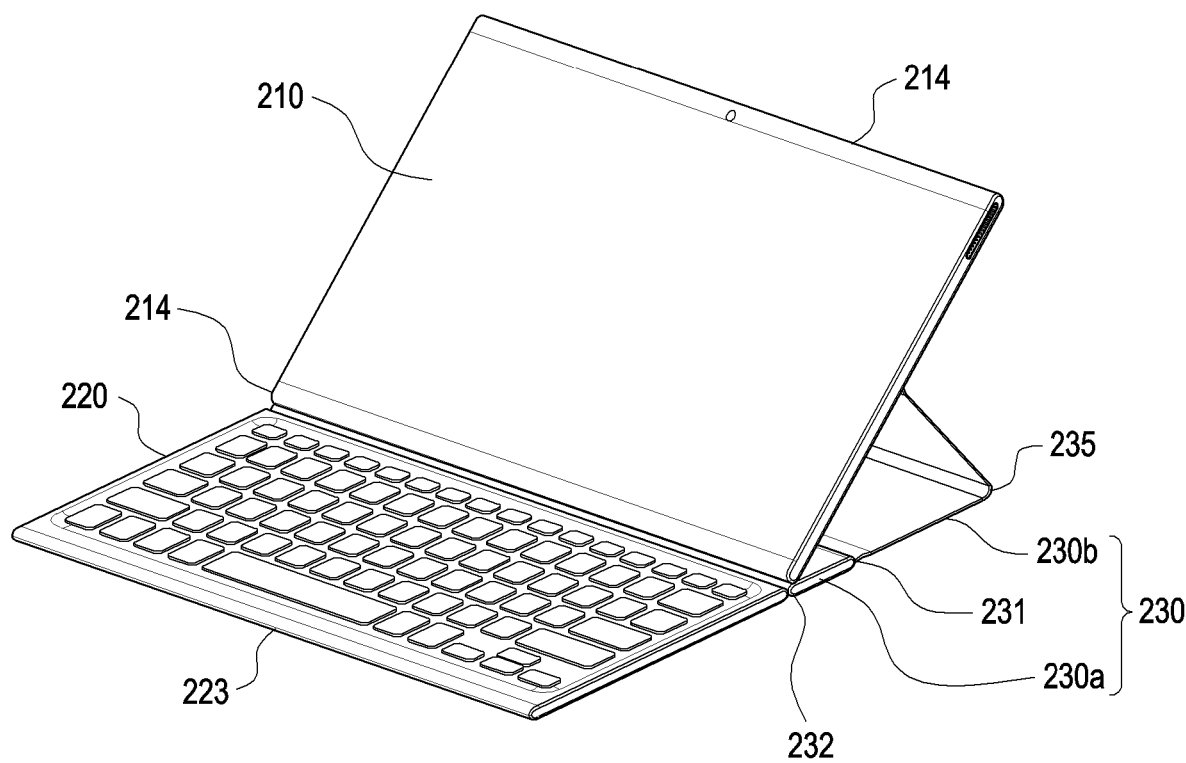
FIG. 14 is a perspective view illustrating another mounting angle of the second cover part in the configuration of an electronic device including an accessory according to various embodiments of the disclosure.
Figure 15:
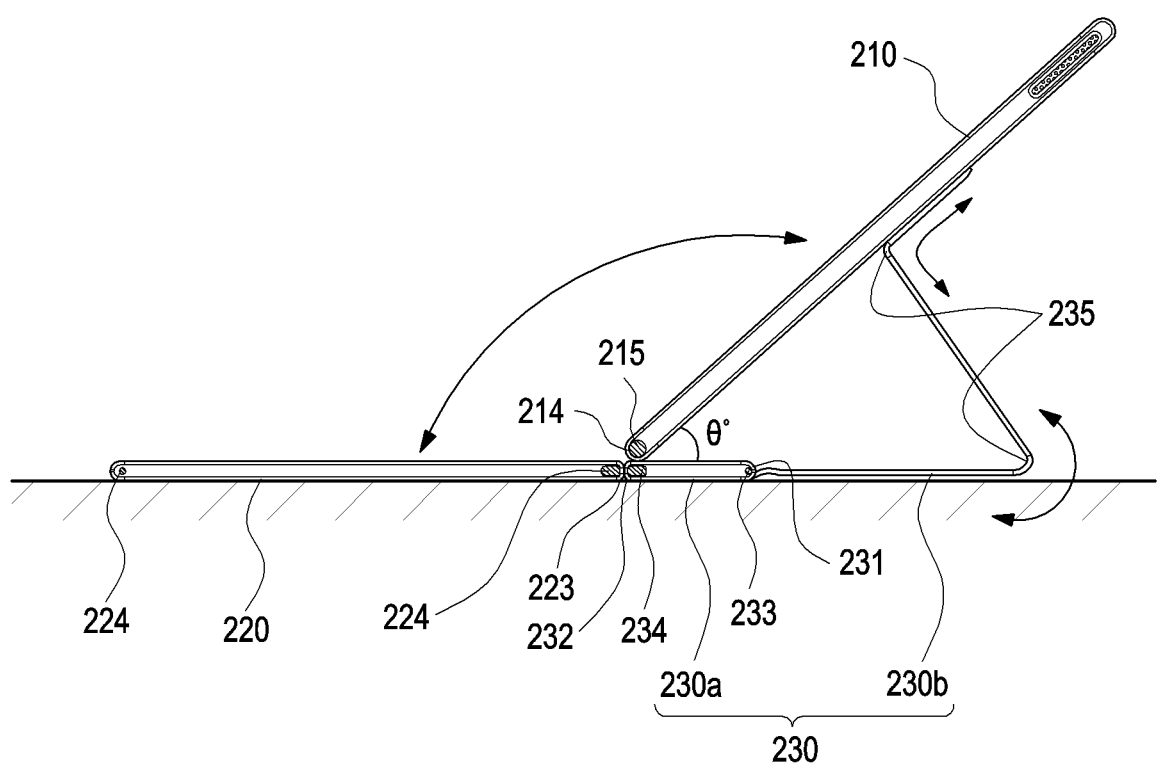
FIG. 15 is a cross-sectional view illustrating another mounting angle of the second cover part in the configuration of the electronic device including an accessory according to various embodiments of the disclosure.

FIG. 14 is a perspective view illustrating another mounting angle of the second cover part in the configuration of an electronic device including an accessory according to various embodiments of the disclosure, and FIG. 15 is a cross-sectional view illustrating another mounting angle of the second cover part in the configuration of an electronic device including an accessory according to various embodiments of the disclosure.

Referring to FIGS. 14 and 15, an electronic device, which includes an accessory, may include first and second electronic devices 210 and 220 and an accessory structure 230, and the accessory structure 230 may include first and second cover parts 230a and 230b. In this state, when the second cover part 230b is used as a cradle, first, it is possible to rotate the second cover part 230b disposed on the rear face of the first electronic device 210 from the first cover part 230a. Then, since the first magnet 215 of the first electronic device 210 and the third magnet 233 of the first cover part 230a are attached to each other by magnetic force, it is possible to rotate the first electronic device 210 from the first cover part 230a. At this time, the first curved face 214 of the first electronic device 210 is rotatable along the third curved face 231 of the first cover part 230a. Then, it is possible to separate the first curved face 214 of the first electronic device 210 from the third curved face 231 of the first cover part 230a, and to make the first curved face 214 of the first electronic device 210 face the fourth curved face 232 of the first cover part 230a. At this time, the first magnet 215 of the first electronic device 210 is attachable to the fourth magnet 234 included in the fourth curved face 232 of the first cover part 230a by magnetic force. In this state, the second cover part 230b is capable of being bent by at least one bent portion 235 included therein. At the same time, one end of the second cover part 230b is attachable to at least one mounting magnet 216 provided on the rear face of the first electronic device 210. As described above, by bending the second cover part 230b to be disposed behind the first electronic device 210 and to support the first electronic device 210, it is possible to use the second cover part 230b as a cradle. At this time, the fourth curved face 232 of the first cover part 230a faces the second curved face 223 of the second electronic device 220, and the fourth magnet 234 included in the fourth curved face 232 of the first cover part 230a is attachable to the second magnet 224 included in the second curved face 223 of the second electronic device 220 by magnetic force. That is, it is possible to make the first and second curved faces 214 and 223 of the first and second electronic devices 210 and 220 simultaneously face the fourth curved face 232 of the first cover part 230a. Accordingly, the fourth magnet 234 included in the fourth curved face 232 of the first cover part 230a is attachable to the first and second magnets 215 and 224 included in the first and second curved faces 214 and 223 of the first and second electronic devices 210 and 220 by magnetic force.

At this time, by attaching the first magnet 215 of the first electronic device 210 not to the third magnet 233 included at one side of the first cover part 230a, but to the fourth magnet 234 included in the other side of the first cover part 230a, it is possible to adjust the mounting angle of the first electronic device 210. Accordingly, the first electronic device 210 may be mounted to be inclined at a mounting angle θ of, for example, 40 degrees from the floor.

According to an embodiment, when the first and second cover parts 230a and 230b are used as a standing cradle or a typing cradle, the second cover part 230b is capable of being bent while being rotated, so that the second cover part 230b is capable of supporting the rear face of the first electronic device 210 so as to mount the electronic device 10 in the standing state. The mounting angle θ of the first electronic device 210 may become 40 degrees by being further laid down from 60 degrees from the floor. The second electronic device 220 may be mounted such that typing can be performed thereon by attaching the fourth magnet 234 included in the fourth curved face 232 of the first cover portion 230a to the second magnet 224 included in the second curved face 223 of the second electronic device 220 by magnetic force and bringing the first cover part 230a into close contact with the floor.

According to an embodiment, the first electronic device 210 may be a tablet PC including a display unit on which an image is capable of being viewed, and the second electronic device 220 may be a keyboard on which typing is capable of being performed.

According to an embodiment, the first and second electronic devices 210 and 220 and the first cover part 230a may include a near-field communication module (e.g., the near-field communication module 192 in FIG. 1) such that the first and second electronic devices 210 and 220 and the first cover part 230a transmit and receive signals for near-field communication with each other. Since the operation of the near-field communication modules (e.g., the short-range module 192 in FIG. 1) have been described in connection with the embodiments related to FIGS. 10 to 14, a description thereof will be omitted. That is, the near-field communication modules 192 (e.g., the near-field communication module 192 in FIG. 1) may change the input mode or the operating mode under the control of the processor. The processor may control the near-field communication modules (e.g., the near-field communication module 192 in FIG. 1) to transmit and receive data to and from the first and second electronic devices 210 and 220 and the first cover part 230a. Accordingly, the user may check data displayed on the display unit of the first electronic device 210 and may perform typing using the keyboard included in the second electronic device 220.

According to an embodiment, when the at least one first magnet 215 of the first electronic device 210 and the at least one third magnet 233 of the accessory are attached to or detached from each other by magnetic force, the first electronic device 210 may perform an input mode or an operation mode, and when the at least one second magnet 224 of the second electronic device 220 and the at least one fourth magnet 234 of the accessory are attached to or detached from each other by magnetic force, the second electronic device 200 may perform an input mode or an operation mode.

Figure 16:
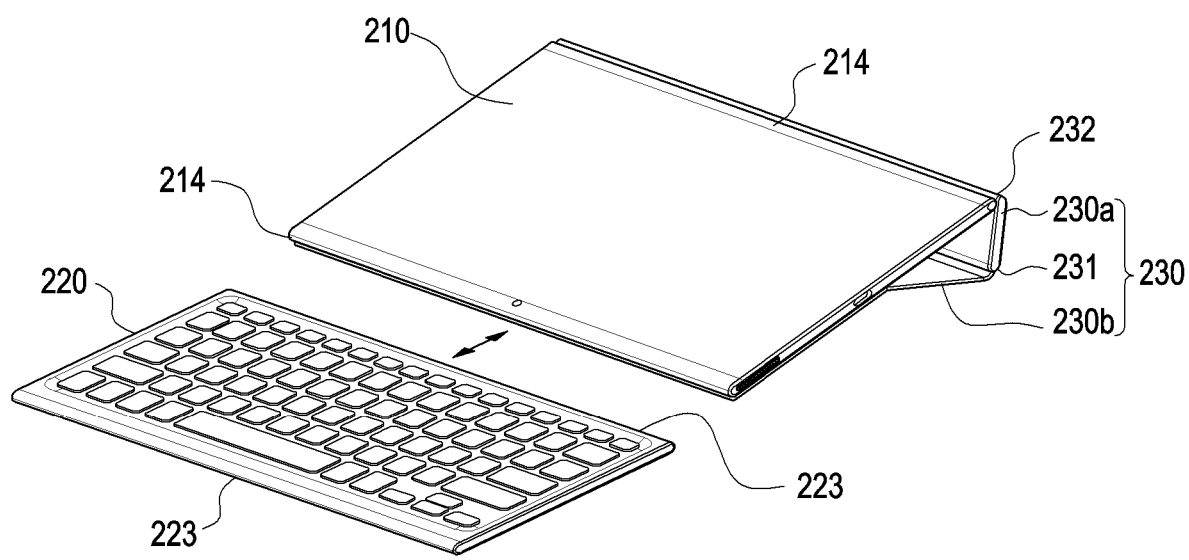
FIG. 16 is a perspective view illustrating still another mounting angle of the second cover part in the configuration of the electronic device including an accessory according to various embodiments of the disclosure.
Figure 17:
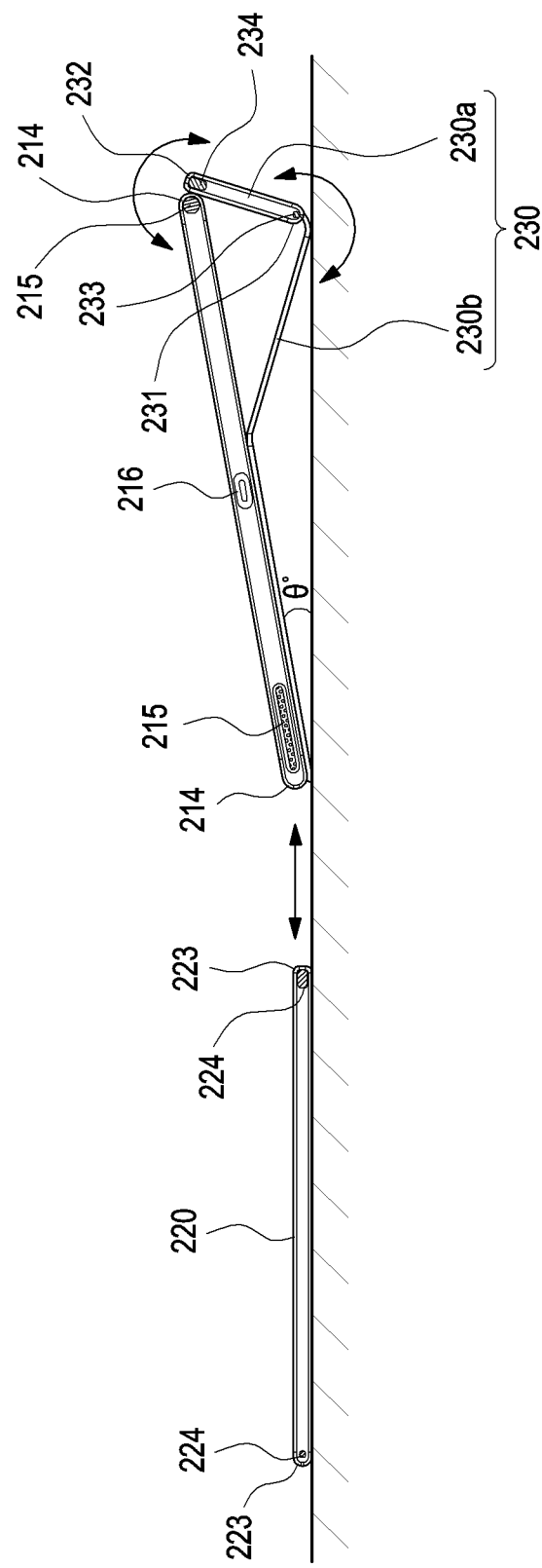
FIG. 17 is a cross-sectional view illustrating still another mounting angle of the second cover part in the configuration of the electronic device including an accessory according to various embodiments of the disclosure.

FIG. 16 is a perspective view illustrating still another mounting angle of the second cover part in the configuration of an electronic device including an accessory according to various embodiments of the disclosure, and FIG. 17 is a cross-sectional view illustrating still another mounting angle of the second cover part in the configuration of an electronic device including an accessory according to various embodiments of the disclosure.

Referring to FIGS. 16 and 17, the electronic device including an accessory (e.g., the electronic device 101 of FIG. 1) may include first and second electronic devices 210 and 220 and an accessory structure 230. The accessory structure 230 may include first and second cover parts 230a and 230b. In this state, when the second cover part 230b is used as a cradle, first, it is possible to rotate the second cover part 230b disposed on the rear face of the first electronic device 210 from the first cover part 230a. Then, it is possible to attach the first magnet 215 of the first electronic device 210 to the fourth magnet 234 of the first cover part 230a. It is possible to rotate the first electronic device 210 from the first cover part 230a. At this time, the first curved face 214 of the first electronic device 210 is rotatable along the fourth curved face 232 of the first cover part 230a. At this time, the first magnet 215 of the first electronic device 210 is rotatable in the state of being attached to the fourth magnet 234 included in the fourth curved face 232 of the first cover part 230a by magnetic force. In this state, the second cover part 230b is capable of being bent by at least one bent portion 235 included therein. At the same time, the second cover part 230b is attachable to at least one mounting magnet 216 provided on the rear face of the first electronic device 210. As described above, by bending the second cover part 230b to face the rear face of the first electronic device 210 and to support the first electronic device 210, it is possible to use the second cover part 230b as a cradle. At this time, the first electronic device 210 may be mounted to be inclined at a mounting angle θ of 10 degrees from the floor. That is, the first electronic device 210 may be gently laid on the floor to form the above-mentioned mounting angle.

In this state, the second electronic device 220 may be separated from the first electronic device 210 by a predetermined distance, and the second electronic device 220 may be in close contact with the floor. The first curved face 214 of the first electronic device 210 and the second curved face 223 of the second electronic device 220 may be separated from each other. The first electronic device 210 and the second electronic device 220 may be disposed in the state of being separated from each other by a predetermined distance.

According to an embodiment, when the first and second cover parts 230a and 230b are used as a standing cradle or a typing cradle, the second cover part 230b is capable of being bent while being rotated, so that the second cover part 230b is capable of supporting the rear face of the first electronic device 210 so as to mount the electronic device 10 in the standing state. The first electronic device 210 may be mounted at a mounting angle θ of 10 degrees from the floor. In this state, the second electronic device 220 may be separated from the first electronic device 210 and may be mounted such that typing can be performed thereon.

According to an embodiment, the first electronic device 210 may be a tablet PC including a display unit on which an image is capable of being viewed, and the second electronic device 220 may be a keyboard on which typing is capable of being performed.

According to an embodiment, the first and second electronic devices 210 and 220 and the first cover part 230a may include a near-field communication module (e.g., the near-field communication module 192 in FIG. 1) such that the first and second electronic devices 210 and 220 and the first cover part 230a transmit and receive signals for near-field communication with each other. Since the operation of the near-field communication modules (e.g., the near-field communication module 192 in FIG. 1) have been described in connection with the embodiments related to FIGS. 10 to 14, a description thereof will be omitted. That is, the near-field communication modules 192 may change the input mode or the operating mode under the control of the processor (e.g., the processor 120 in FIG. 1). The processor (e.g., the processor 120 in FIG. 1) may control the near-field communication module (e.g., the near-field communication module 192 in FIG. 1) to transmit/receive data to/from the first and second electronic devices 210 and 220 and the first cover part 230a. Accordingly, the user may check data displayed on the display unit of the first electronic device 210 and may perform typing using the keyboard included in the second electronic device 220.

According to an embodiment, when the at least one first magnet 215 of the first electronic device 210 and the at least one third magnet 233 of the accessory structure are attached to or detached from each other by magnetic force, the first electronic device 210 may perform an input mode or an operation mode, and when the at least one second magnet 224 of the second electronic device 220 and the at least one fourth magnet 234 of the accessory are attached to or detached from each other by magnetic force, the second electronic device 220 may perform an input mode or an operation mode.

Figure 18:
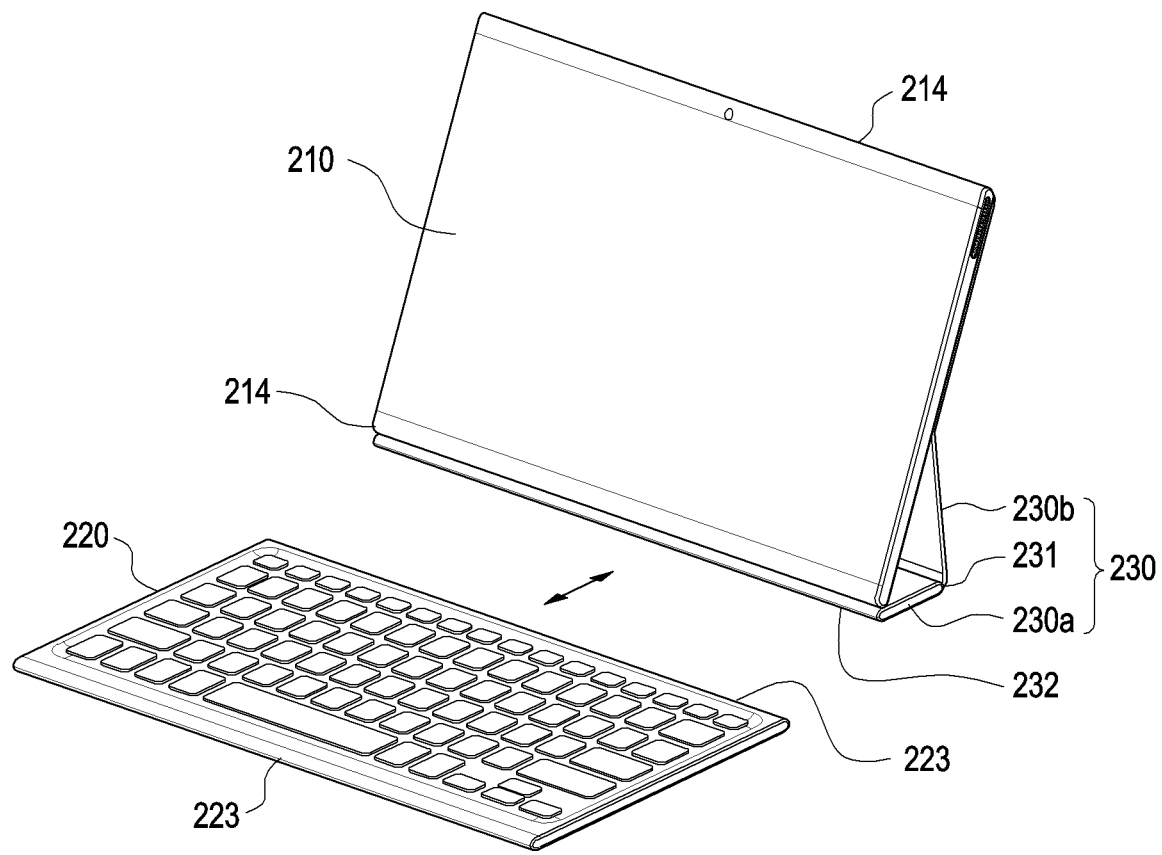
FIG. 18 is a perspective view illustrating still another mounting angle of the second cover part in the configuration of the electronic device including an accessory according to various embodiments of the disclosure.
Figure 19:
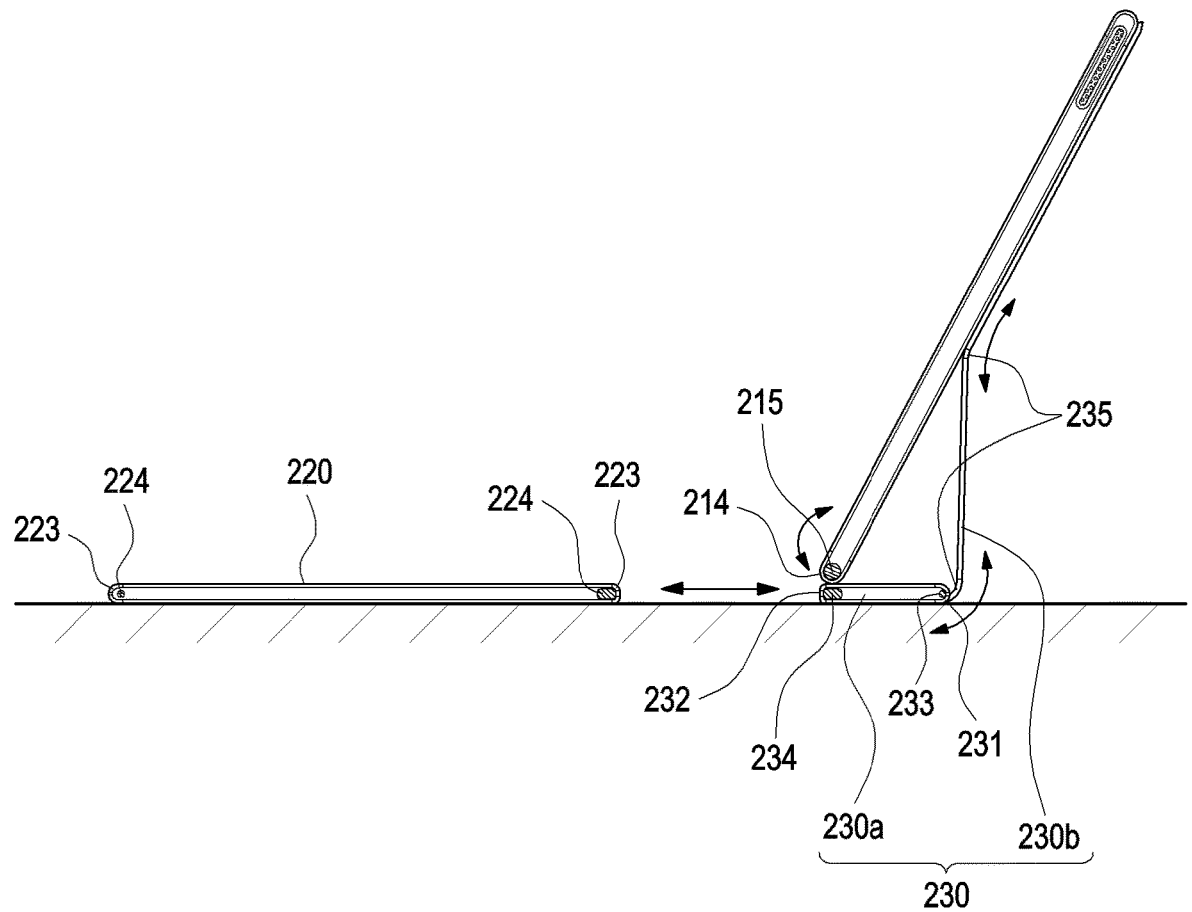
FIG. 19 is a cross-sectional view illustrating another mounting angle of the second cover part in the configuration of an electronic device including an accessory according to various embodiments of the disclosure.

FIG. 18 is a perspective view illustrating still another mounting angle of the second cover part in the configuration of an electronic device including an accessory according to various embodiments of the disclosure, and FIG. 19 is a cross-sectional view illustrating another mounting angle of the second cover part in the configuration of an electronic device including an accessory according to various embodiments of the disclosure.

Referring to FIGS. 18 and 19, an electronic device (e.g., the electronic device 101 in FIG. 1) including an accessory may include first and second electronic devices 210 and 220 and an accessory structure 230, and the accessory structure 230 may include first and second cover parts 230a and 230b. In this state, when the second cover part 230b is used as a cradle, first, it is possible to rotate the second cover part 230b disposed on the rear face of the first electronic device 210 from the first cover part 230a. Then, it is possible to attach the first magnet 215 of the first electronic device 210 to the fourth magnet 234 of the first cover part 230a. In this state, it is possible to rotate the first electronic device 210 from the first cover part 230a. At this time, the first curved face 214 of the first electronic device 210 is rotatable along the fourth curved face 232 of the first cover part 230a. At this time, the first magnet 215 of the first electronic device 210 is rotatable in the state of being attached to the fourth magnet 234 included in the fourth curved face 232 of the first cover part 230a by magnetic force. In this state, the second cover part 230b is capable of being bent by at least one bent portion 235 included therein. At the same time, the second cover part 230b is attachable to at least one mounting magnet 216 provided on the rear face of the first electronic device 210. As described above, by bending the second cover part 230b to face the first electronic device 210 and to support the first electronic device 210, it is possible to use the second cover part 230b as a cradle. At this time, the first electronic device 210 may be mounted to be inclined at a mounting angle θ of 65 degrees from the floor. That is, the first electronic device 210 may form a steep inclination angle from the floor.

In this state, the second electronic device 220 may be separated from the first electronic device 210 by a predetermined distance, and the second electronic device 220 may be in close contact with the floor. That is, the first curved face 214 of the first electronic device 210 and the second curved face 223 of the second electronic device 220 may be separated from each other. The first electronic device 210 and the second electronic device 220 may be disposed in the state of being separated from each other by a predetermined distance.

According to an embodiment, when the first and second cover parts 230a and 230b are used as a standing cradle or a typing cradle, the second cover part 230b is capable of being bent while being rotated, so that the second cover part 230b is capable of supporting the rear face of the first electronic device 210 so as to mount the first electronic device 210 in the standing state. The first electronic device 210 may be mounted at a mounting angle θ of 65 degrees from the floor. In this state, the second electronic device 220 may be separated from the first electronic device 210 and may be mounted such that typing can be performed thereon.

According to an embodiment, the first electronic device 210 may be a tablet PC including a display unit on which an image is capable of being viewed, and the second electronic device 220 may be a keyboard on which typing is capable of being performed.

According to an embodiment, the first and second electronic devices 210 and 220 and the first cover part 230a may include a near-field communication module (e.g., the near-field communication module 192 in FIG. 1) such that the first and second electronic devices 210 and 220 and the first cover part 230a transmit and receive signals for near-field communication with each other. Since the operation of the near-field communication modules (e.g., the short-range module 192 in FIG. 1) have been described in connection with the embodiments related to FIGS. 10 to 14, a description thereof will be omitted. That is, the near-field communication modules 192 (e.g., the near-field communication module 192 in FIG. 1) may change the input mode or the operating mode under the control of the processor (e.g., the processor 120 in FIG. 1). The processor (e.g., the processor 120 in FIG. 1) may control the near-field communication module (e.g., the near-field communication module 192 in FIG. 1) to transmit and receive data to and from the first and second electronic devices 210 and 220 and the first cover part 230a. Accordingly, the user may check data displayed on the display unit of the first electronic device 210, and may perform typing using the keyboard included in the second electronic device 220.

According to an embodiment, when the at least one first magnet 215 of the first electronic device 210 and the at least one third magnet 233 of the accessory structure are attached to or detached from each other by magnetic force, the first electronic device 210 may perform an input mode or an operation mode, and when the at least one second magnet 224 of the second electronic device 220 and the at least one fourth magnet 234 of the accessory structure are attached to or detached from each other by magnetic force, the second electronic device 220 may perform an input mode or an operation mode.

According to various embodiments of the disclosure, an electronic device, which includes an accessory, may include: a first electronic device having a first curved face on at least one side face and including at least one first magnet in the first curved face; a second electronic device having a second curved face on at least one side face and including at least one second magnet in the second curved face; and an accessory structure including third and fourth curved faces facing the first and second curved faces, and including at least one third magnet and at least one fourth magnet in the third curved face and the fourth curved face, respectively. The accessory structure may allow the first electronic device to be mounted at various angles when the at least one first magnet and the at least one second magnet are attached to/detached from the at least one third magnet and the at least one fourth magnet of the first and second electronic devices by magnetic force and the first and second curved faces of the first and second electronic devices are rotated along the third and fourth curved faces, and the accessory structure is bent during the rotation.

According to various embodiments of the disclosure, the first electronic device may include at least one of a notebook computer, a netbook, a smartphone, and a tablet PC, and the second electronic device may include a keyboard.

According to various embodiments of the disclosure, the accessory structure may include: a first cover part located on a portion of a front face of the first electronic device, and including the third curved face formed on one side thereof to face the first curved face, the at least one third magnet located in the third curved face, the fourth curved face formed on another side thereof to face the second curved face, and the at least one fourth magnet located in the fourth curved face; and a second cover part located on a rear face of the first electronic device, and rotatably connected to the first cover part, the second cover part being bent while being rotated to face a least a portion of the rear face of the first electronic device and to allow the first electronic device to be mounted at various angles. The at least one third magnet and the at least one fourth magnet may be attached to/detached from the at least one first magnet and the at least one second magnet by magnetic force, and the first and second curved faces of the first and second electronic devices may be rotated along the third and fourth curved faces of the first cover part.

According to various embodiments of the disclosure, each of the first, second, third, and fourth magnets may have a cylindrical bar shape.

According to various embodiments of the disclosure, in each of the first, second, third, and fourth magnets, a first portion may generate magnetic force, and wherein a second portion opposite the first portion may include a shield member configured to block the magnetic force of each of the magnets. The shield member may include a metal material or a synthetic resin material, which blocks the magnetic force of each of the magnets.

According to various embodiments of the disclosure, each of the first, second, third, and fourth curved faces includes at least one of circular, hemisphere, and elliptical shapes.

According to various embodiments of the disclosure, the first cover part may include at least one of a speaker, a microphone, a camera, a connector terminal, a key button, and a touch screen.

According to various embodiments of the disclosure, the second cover part may include at least one bent portion that allows the second cover part to be bent.

According to various embodiments of the disclosure, when the second cover part is used or is not used as a cradle, the second cover part may be attached to/detached from at least one mounting magnet included in the first electronic device.

According to an embodiment of the disclosure, the first electronic device may perform an input mode or an operation mode by attaching/detaching the at least one first magnet of the first electronic device to/from the at least one third magnet of the accessory structure by magnetic force, and the second electronic device may perform an input mode or an operation mode by attaching/detaching the at least one second magnet of the second electronic device to/from the at least one fourth magnet of the accessory structure by magnetic force.

According to various embodiments of the disclosure, each of the first electronic device, the second electronic device, and the first cover part may include a near-field communication module such that the first and second electronic devices and the first cover part transmit and receive a signal for near-field communication with each other.

According to various embodiments of the disclosure, when the second cover part is used as a cradle, the first magnet of the first electronic device is attached to the third magnet of the first cover part, the first curved face of the first electronic device is rotated along the third curved face of the first cover part, the second cover part is rotated and bent to be attached to the at least one mounting magnet provided on the rear face of the first electronic device, so that the second cover part is used as a cradle, and the second magnet of the second electronic device may be attached to/detached from the fourth magnet of the first cover part.

According to various embodiments of the disclosure, when the first electronic device is mounted at various angles, the first magnet of the first electronic device is separated from the third magnet of the first cover part and is attached to the fourth magnet, the first curved face of the first electronic device is rotated along the fourth curved face of the first cover part, the second cover part is rotated and bent to be attached to the at least one mounting magnet provided on the rear face of the first electronic device, and the second cover part is located to face at least a portion of the rear face of the first electronic device, so that the second cover part is used as a cradle, and the second magnet of the second electronic device may be attached to/detached from the fourth magnet of the first cover part.

According to various embodiments of the disclosure, the accessory may include: a cover part including a first curved face and configured to cover at least one face of an electronic device; and at least one first magnet included in the first curved face of the cover part, the first magnet including a first portion configured to generate magnetic force and a shield member configured to block the magnetic force of the first portion. The first magnet may include the first portion configured to generate magnetic force and the second portion configured to block the magnetic force of the first magnet.

Figure 20:
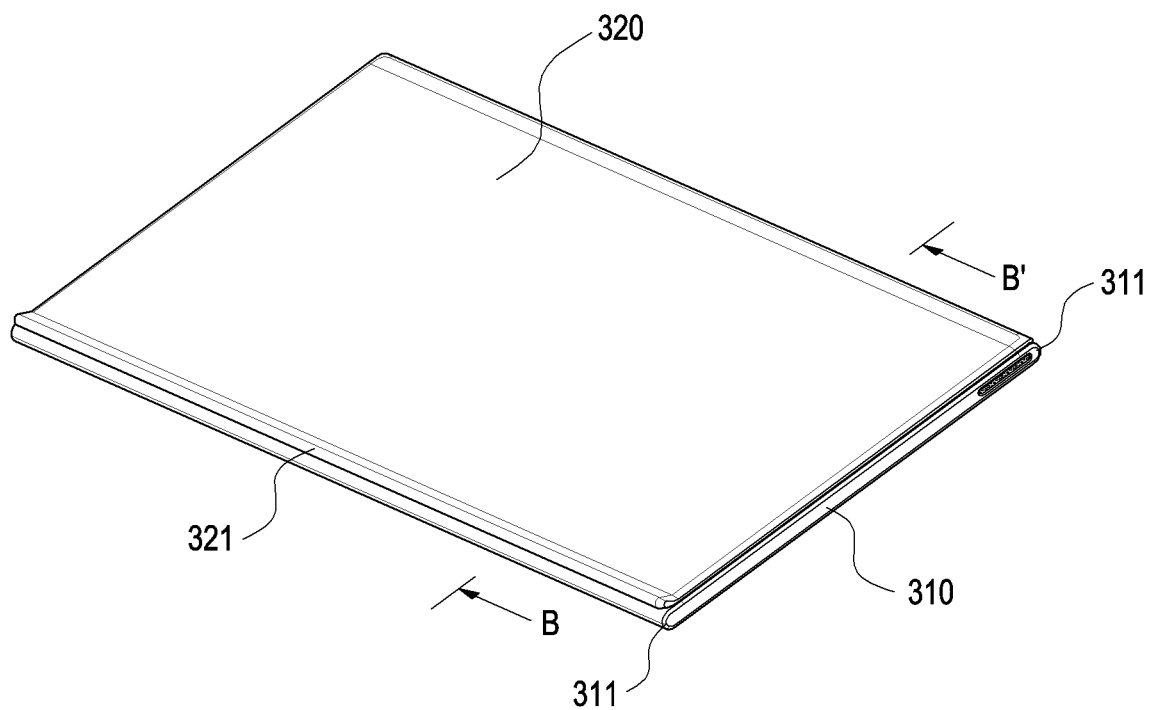
FIG. 20 is a perspective view illustrating the assembled state of an electronic device including an accessory according to various other embodiments of the disclosure.
Figure 21:
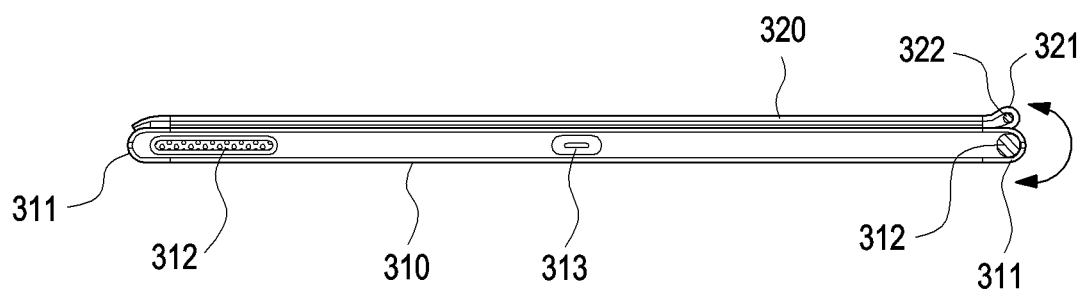
FIG. 21 is a cross-sectional view taken along line B-B' in FIG. 19.

FIG. 20 is a perspective view illustrating the assembled state of an electronic device including an accessory according to various other embodiments of the disclosure. FIG. 21 is a cross-sectional view taken along line B-B' in FIG. 19.

Referring to FIGS. 20 and 21, the electronic device including an accessory (e.g., the electronic device 101 of FIG. 1) may include an electronic device 310 and an accessory structure 320. For example, first curved faces 311 may be formed on the opposite side faces of the electronic device 310 to face a second curved face 321 of the accessory structure 320, which will be described later. Each of the first curved faces 311 may include therein at least one first magnet 312 to be attached to/detached from at least one second magnet 322 included in the accessory structure 320. The accessory structure 320 may be located on the front face of the electronic device 310, and may include the second curved face 321 to face the first curved faces 311 of the electronic device 310, and may include at least one second magnet 322 in the second curved face 321 to be attached to/detached from the at least one first magnet 312 of the electronic device 310.

As described above, in the accessory structure 320, the at least one second magnet 322 is attachable to/detachable from the at least one first magnet 312 of the electronic device 310 by magnetic force, and the second curved face 321 of the cover part 320 is rotatable along the first curved face 311 of the electronic device 310. During the rotation, the accessory structure 320 is capable of being bent so as to allow the electronic device 310 to be mounted at various angles. Therefore, it is possible to easily attach/detach the electronic device 310 to/from the accessory structure 320, thereby facilitating the use of the product. Further, it is possible to freely adjust the mounting angle of the electronic device 310, thereby facilitating the use of the accessory as well as improving the convenience of the user. By attaching/detaching or rotating the electronic devices 310 using the first and second magnets 312 and 322, the separate mounting portion and hinge portion of the conventional electronic device are not required, and thus it is possible to reduce the thickness, volume, and weight of the product and to design a product to have a beautiful appearance.

As illustrated in FIG. 21, the accessory structure 320 may include a cover part 320. The cover part 320 may be located on the front face of the first electronic device 310, and a second curved face 321 may be formed at one side of the cover part 320 to face the first curved face 311 of the electronic device 310. The second curved face 321 may include therein at least one second magnet 322, which is attachable to/detachable from the at least one first magnet 312 of the electronic device 310 by magnetic force so as to make the second curved face 321 rotatable along the first face 311 of the first electronic device 310 when rotated in the state in which the second magnet 322 is attached to the first magnet 312.

During the rotation, the cover part 320 is capable of being bent to face at least a portion of the rear face of the electronic device 310 and to be located behind the electronic device 310, so that the electronic device 310 can be mounted at various angles.

For example, when the cover part 320 is used as a cradle, the cover part 320 may be rotated away from the front face of the electronic device 310. At this time, the second curved face 321 of the cover part 320 is rotatable along the first curved face 311 of the electronic device 310. In the state in which the at least one first magnet 312 included in the first curved face 311 and the at least one second magnet 322 included in the second curved face 321 are attached to each other by magnetic force, the second curved face 321 of the cover part 320 is rotatable along the first curved face 311 of the electronic device 310. In this state, since the cover part 320 is provided with at least one bent portion (e.g., the bent portion 323 in FIG. 22C) that allows the cover part 320 to be bent, the cover part 320 may be bent by the at least one bent portion (e.g., the bent portion 323 in FIG. 22C) while being rotated, so that the cover part 320 can be used as a cradle. At this time, the cover part 320 may be attached to the at least one mounting magnet (e.g., the mounting magnet 313 in FIG. 21) included in the electronic device 310, so that the use of the cover part 320 as a cradle can be supported.

Since the structures of the first and second magnets 312 and 322 are the same as those of the first, second, third, and fourth magnets 215, 224, 233 and 234 shown in FIGS. 9A and 9B, descriptions thereof will be omitted.

Figure 22:
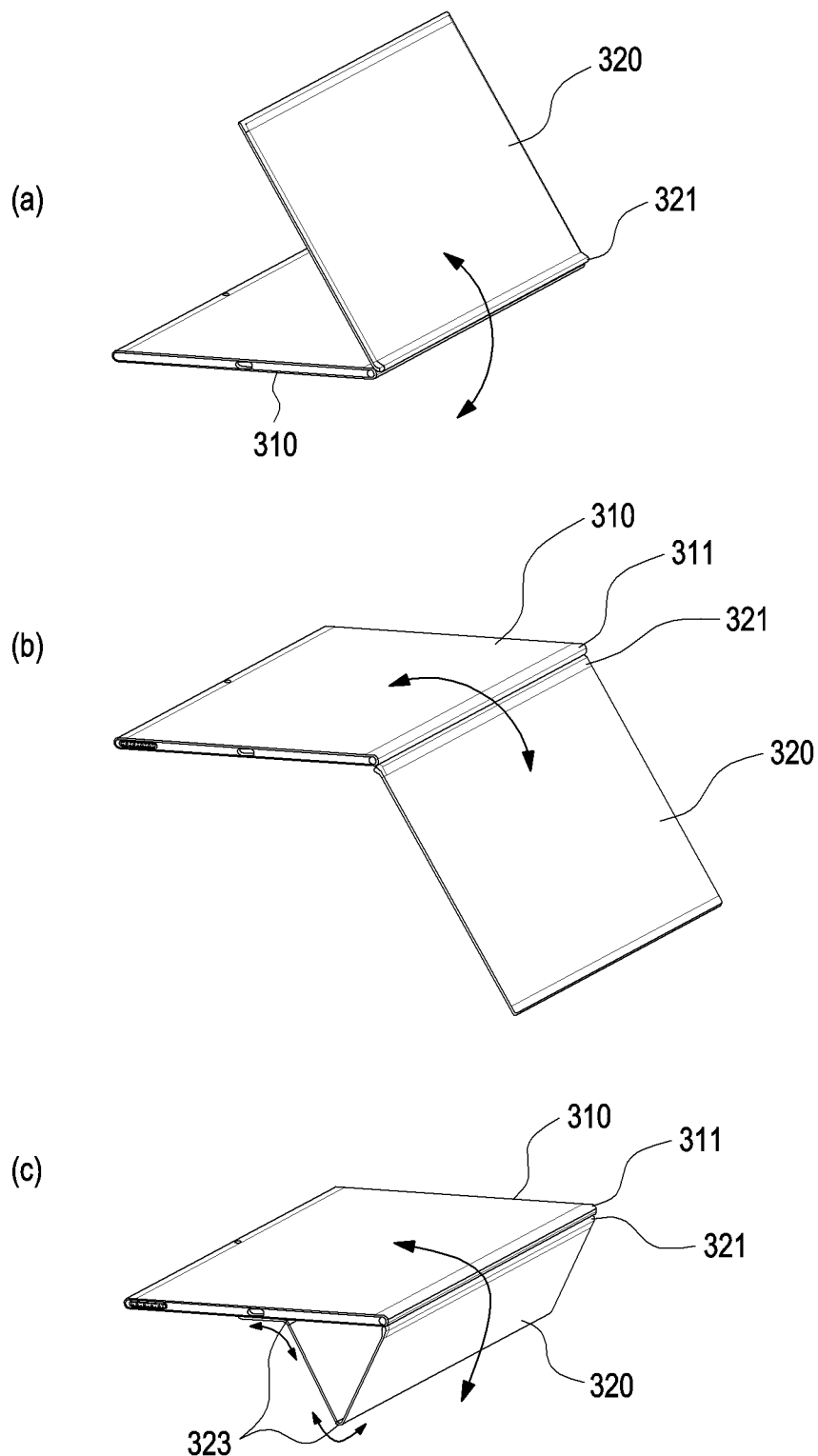
FIG. 22A is a perspective view illustrating the operating state of the electronic device including the accessory according to various other embodiments of the disclosure.
FIG. 22B is a perspective view illustrating the operating state of the electronic device including the accessory according to various other embodiments of the disclosure.
FIG. 22C is a perspective view illustrating the operating state of the electronic device including the accessory according to various other embodiments of the disclosure.
Figure 23:
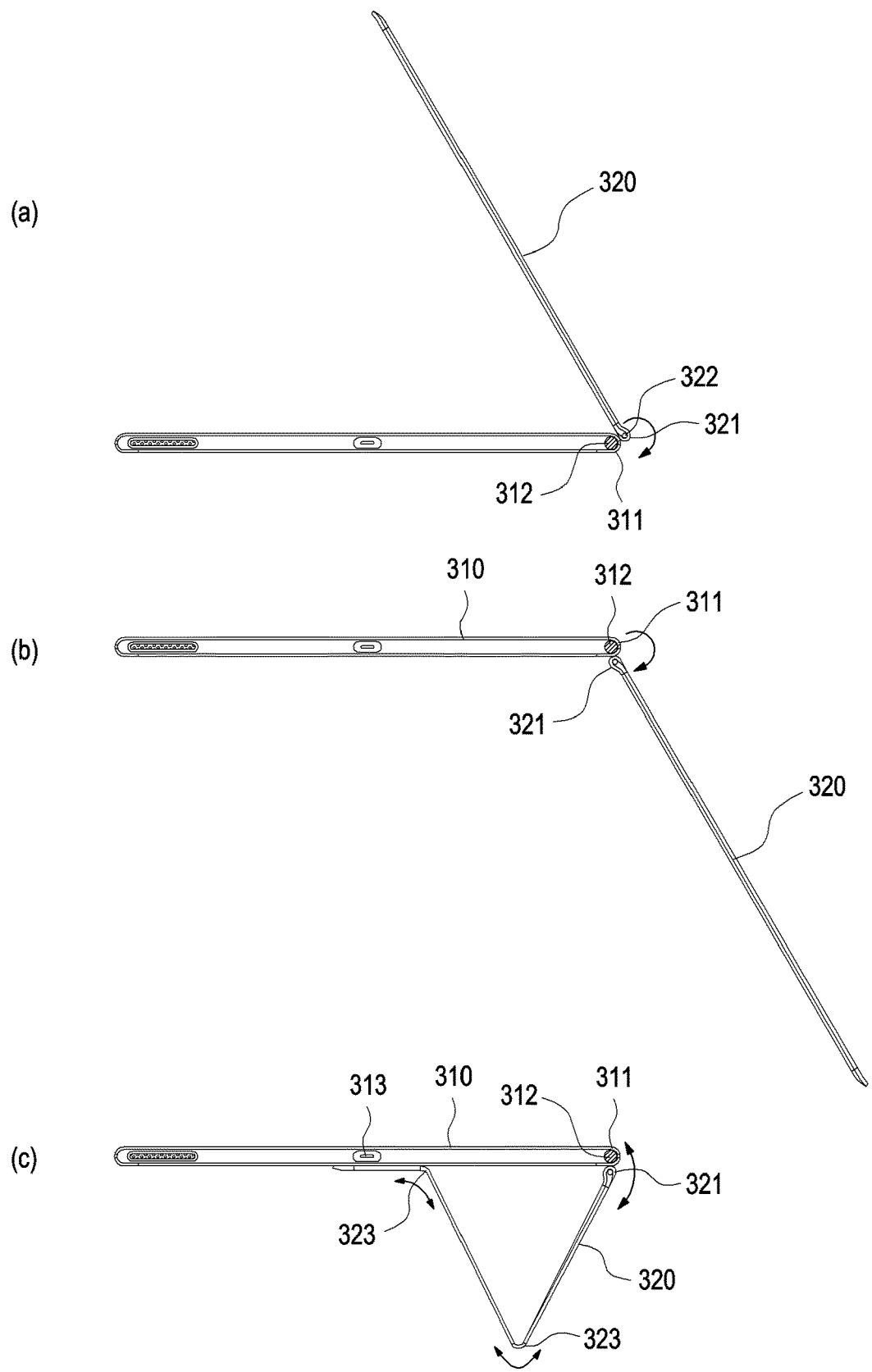
FIG. 23A is a cross-sectional view illustrating the operating state of the electronic device including the accessory according to various other embodiments of the disclosure.
FIG. 23B is a cross-sectional view illustrating the operating state of the electronic device including the accessory according to various other embodiments of the disclosure.
FIG. 23C is a cross-sectional view illustrating the operating state of the electronic device including the accessory according to various other embodiments of the disclosure.

FIG. 22A is a perspective view illustrating the operating state of the electronic device including the accessory according to various other embodiments of the disclosure, FIG. 22B is a perspective view illustrating the operating state of the electronic device including the accessory according to various other embodiments of the disclosure, and FIG. 22C is a perspective view illustrating the operating state of the electronic device including the accessory according to various embodiments. FIG. 23A is a cross-sectional view illustrating the operating state of the electronic device including the accessory according to various other embodiments of the disclosure, FIG. 23B is a cross-sectional view illustrating the operating state of the electronic device including the accessory according to various other embodiments of the disclosure, and FIG. 23C is a cross-sectional view illustrating the operating state of the electronic device including the accessory according to various other embodiments of the disclosure.

Referring to FIGS. 22A, 22B, and 22C and FIGS. 23A, 23B, and 23C, an electronic device including an accessory may include an electronic device 310 and an accessory structure 320, and the accessory structure 320 may include a cover part 320. The first curved faces 311 formed on the opposite sides of the electronic device 310 are capable of facing the second curved face 321 of the cover part 320. At this time, the first magnet 312 included in each of the first curved faces 311 is attachable to the second magnet 322 included in the second curved face 321 of the cover part 320 by magnetic force.

As illustrated in FIGS. 22A and 23A, when the cover part 320 is rotated, first, the cover part 320 disposed on the front face of the electronic device 310 may be rotated. Then, since the first magnet 312 of the electronic device 310 and the second magnet 322 of the cover part 320 are attached to each other by magnetic force, it is possible to rotate the cover part 320 from the first electronic device 310. As illustrated in FIG. 22B and FIG. 23B, the second curved face 321 of the cover part 320 is rotatable along the first curved face 311 of the first electronic device 310. In this state, as illustrated in FIGS. 22C and 23C, the cover part 320 may be bent due to the at least one bent portion 323 included in the cover part 320. At the same time, one end of the cover part 320 is attachable to at least one mounting magnet (e.g., the mounting magnet 313 in FIG. 21) provided on the rear face of the electronic device 310.

Figure 24:
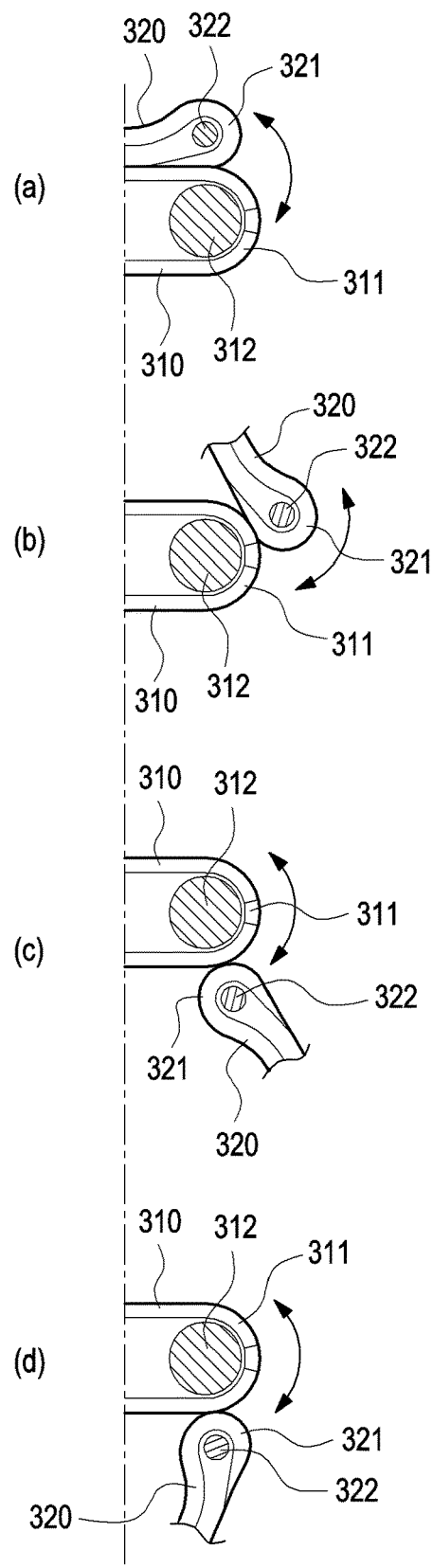
FIG. 24A is a cross-sectional view illustrating the operating state of the first and second magnets in the electronic device including an accessory according to various other embodiments of the disclosure.
FIG. 24B is a cross-sectional view illustrating the operating state of the first and second magnets in the electronic device including an accessory according to various other embodiments of the disclosure.
FIG. 24C is a cross-sectional view illustrating the operating state of the first and second magnets in the electronic device including an accessory according to various other embodiments of the disclosure.
FIG. 24D is a cross-sectional view illustrating the operating state of the first and second magnets in the electronic device including an accessory according to various other embodiments of the disclosure.

FIG. 24A is a cross-sectional view illustrating the operating state of the first and second magnets 312 and 322 in the configuration of the electronic device 310 including an accessory according to various other embodiments of the disclosure, FIG. 24B is a cross-sectional view illustrating the operating state of the first and second magnets 312 and 322 in the configuration of the electronic device 310 including an accessory according to various other embodiments of the disclosure, FIG. 24C is a cross-sectional view illustrating the operating state of the first and second magnets 312 and 322 in the configuration of the electronic device 310 including an accessory according to various other embodiments of the disclosure, and FIG. 24D is a cross-sectional view illustrating the operating state of the first and second magnets 312 and 322 in the configuration of the electronic device 310 including an accessory according to various other embodiments of the disclosure.

As illustrated in FIG. 24A, the cover part 320 may be positioned on the front face of the electronic device 310, and the second magnet 322 of the cover part 320 may be attached to the first magnet 312 of the electronic device 310 by magnetic force.

As illustrated in FIG. 24B, when the cover part 320 is rotated from the front face of the electronic device 310, the second curved face 321 of the cover part 320 is rotatable along the first curved face 311 of the electronic device 310 in the state in which the second magnet 322 of the cover part 320 and the first magnet 312 of the electronic device 310 are attached to each other by the magnetic force. That is, the second curved face 321 of the cover part 320 is capable of being moved from the front face to the rear face of the electronic device 310 while rotating along the first curved face 311 of the electronic device 310.

As illustrated in FIG. 24C, the cover part 320 may rotate away from the electronic device 310, that is, the second curved face 321 of the cover part 320 may rotate from the start position to the end position of the first curved face 311 of the electronic device 310 while rotating along the first face 311 of the electronic device 310. At this time, the cover part 320 may rotate the rear face of the electronic device 310, which is the end position.

As illustrated in FIG. 24D, the cover part 320 may be located on the rear face of the electronic device 310 simultaneously when the second curved face 321 of the cover part 320 rotates from the end position of the first curved face 311 of the electronic device 310.

Figure 25:
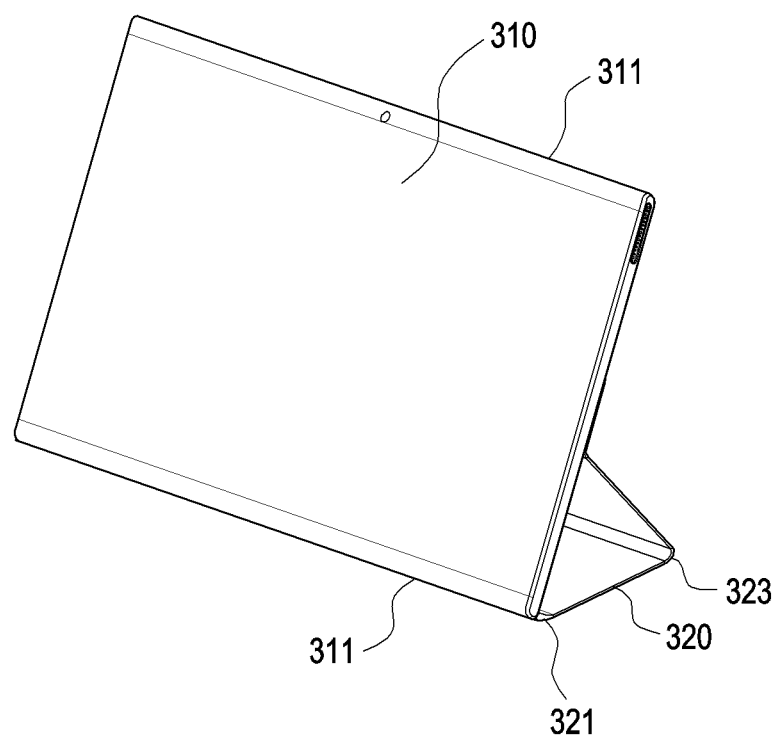
FIG. 25 is a perspective view illustrating the operating state of a cover part in the configuration of an electronic device including an accessory according to various other embodiments of the disclosure.
Figure 26:
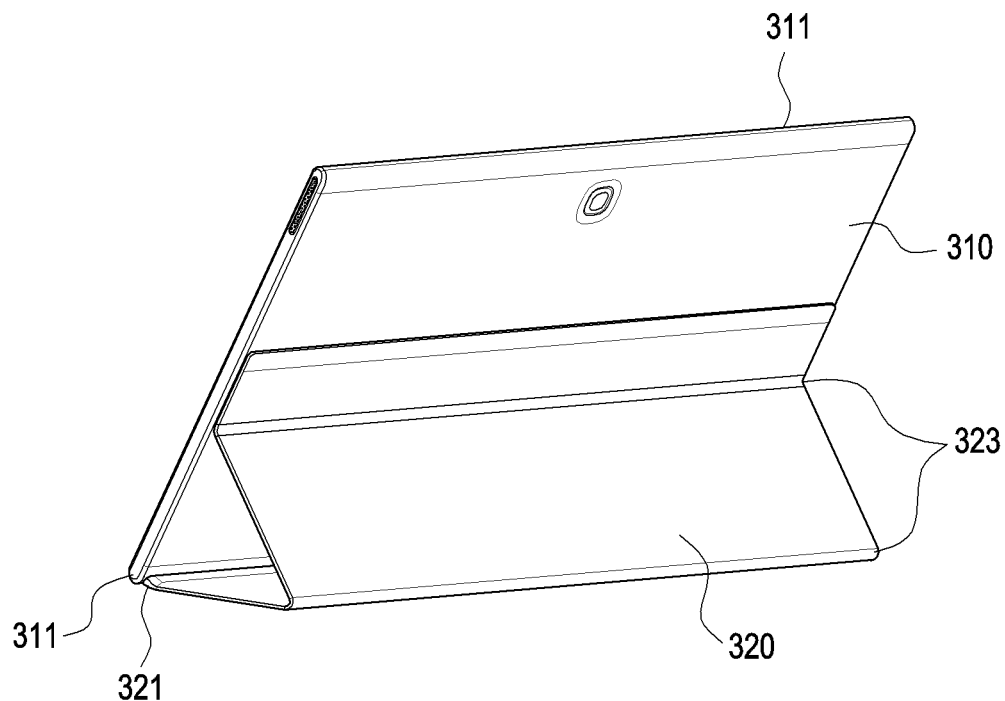
FIG. 26 is a perspective view illustrating the operating state of a cover part in the configuration of an electronic device including an accessory according to various other embodiments of the disclosure.

FIG. 25 is a perspective view illustrating the operating state of a cover part 320 in the configuration of an electronic device 310 according to various other embodiments of the disclosure, and FIG. 26 is a perspective view illustrating the operating state of a cover part 320 in the configuration of the electronic device 310 according to various other embodiments of the disclosure.

Referring to FIGS. 25 and 26, when the cover part 320 is used as a cradle, first, the second curved face 321 of the cover part 320 rotates along the first curved face 3H of the electronic device 310. In this state, the cover part 320 may be bent so as to be disposed on the rear face of the electronic device 310 and to support the electronic device 310, so that the cover part 320 can be used as a cradle. At this time, the second curved face 321 of the cover part 320 faces the first curved face 311 of the electronic device 310, and the second magnet 322 included in the second curved face 321 of the cover part 320 is attachable to the first magnet 312 included in the first curved face 311 of the electronic device 310 by magnetic force. The electronic device 310 may be mounted to be inclined at a mounting angle of a predetermined angle from the floor.

According to an embodiment, when the cover part 320 is used as a standing cradle or a typing cradle, the cover part 320 is capable of being bent while being rotated, so that the cover part 320 is capable of supporting the rear face of the electronic device 310 so as to mount the electronic device 310 in the standing state. When the electronic device 310 and the cover part 320 are laid on the floor in the state of being coupled as described above, the electronic device 310 may be mounted such that typing can be performed thereon.

According to an embodiment, the electronic device 310 may be a tablet PC including a display unit on which an image is capable of being viewed. The cover part 320 may include at least one of a speaker, a microphone, a camera, a connector terminal, a key button, and a touch screen.

According to an embodiment, each of the electronic device 310 and the cover part 320 may include a near-field communication module (e.g., the near-field communication module 192 in FIG. 1) such that the electronic device 310 and the cover part 320 transmit and receive signals for near-field communication with each other.

The near-field communication module 192 (e.g., the near-field communication module 192 in FIG. 1) may include at least one of, for example, a cellular module, a Wi-Fi module, a Bluetooth module, a GNSS module, an NFC module, and an RF module. Various communication modules capable of near-field communication may be applicable as the near-field communication module (e.g., the near-field communication module 192 in FIG. 1) in addition to the disclosed module. In this embodiment, a Bluetooth module may be applicable as the near-field communication module (e.g., the near-field communication module 192 in FIG. 1).

The near-field communication module (e.g., the near-field communication module 192 in FIG. 1) may be provided, for example, as an independent module separately from a communication interface. According to an embodiment, the near-field communication module 192 (e.g., the near-field communication module 192 in FIG. 1) may change the input mode and operating mode under the control of a processor 120 (e.g., the processor 120 in FIG. 1). The processor (e.g., the processor 120 in FIG. 1) may control the near-field communication module (e.g., the near-field communication module 192 in FIG. 1) to transmit/receive data to/from the electronic device 310 and the cover part 320.

That is, the processor 120 may control the overall operation of the electronic device 310 and the cover part 320, and may perform control for the near-field communication function provided by the electronic device 310 and the cover part 320. The processor 120 is a device for driving an operating system (OS) and each component thereof. For example, the processor 120 may be a central processing unit (CPU). Since the specific operation of the near-field communication modules (e.g., the short-range module 192 in FIG. 1) have been described in connection with the embodiments related to FIGS. 10 to 14, a description thereof will be omitted.

According to an embodiment, when the magnet 312 of the electronic device 310 is attached to/detached from the magnet 322 of the accessory structure by magnetic force, the electronic device may perform an input mode or an operation mode.

According to various other embodiments of the disclosure, an electronic device, which includes an accessory, may include an electronic device having a first curved face on at least one side face and including at least one first magnet in the first curved face, and an accessory structure including a second curved face facing the first curved face and at least one second magnet in the second curved face. The accessory structure may allow the electronic device to be mounted at various angles when the at least one second magnet is attached to/detached from the at least one first magnet by magnetic force, the second curved face is rotated along the first curved face, and the accessory structure is bent by the rotation.

According to various other embodiments of the disclosure, the accessory structure may be located on the front face of the electronic device and may include the second face facing the first curved face and the at least one second magnet in the second curved face, the at least one second magnet may be attached to/detached from the at least one first magnet by magnetic force, and the second curved face of the cover part is rotated along the first curved face of the electronic device, and the cover part may be bent while being rotated to face at least a portion of the rear face of the electronic device and to allow the electronic device to be mounted at various angles.

According to various other embodiments of the disclosure, a first portion of the first magnet may generate magnetic force and a second portion of the first magnet opposite the first portion of the first magnet may include a shield member configured to block the magnetic force of the first magnet, and a first portion of the second magnet may generate magnetic force and a second portion of the second magnet opposite the first portion of the second magnet may include a shield member configured to block the magnetic force of the second magnet. The shield member may be made of a metal material.

According to various other embodiments of the disclosure, the cover part may include at least one of a speaker, a microphone, a camera, a connector terminal, a key button, and a touch screen.

According to various other embodiments of the disclosure, each of the electronic device and the cover part may include a near-field communication module such that the electronic device and the cover part transmit and receive a signal for near-field communication with each other.

While the disclosure has been shown and described with reference to certain embodiments thereof, it will be understood by those skilled in the art that various changes in form and details may be made therein without departing from the spirit and scope of the disclosure as defined by the appended claims.

The invention claimed is:

1. An electronic device including an accessory, the electronic device comprising:
    a first electronic device having a first curved face on at least one side face and including at least one first magnet in the first curved face;
    a second electronic device having a second curved face on at least one side face and including at least one second magnet in the second curved face;
    an accessory structure including third and fourth curved faces facing the first and second curved faces, and including at least one third magnet and at least one fourth magnet in the third curved face and the fourth curved face, respectively,
    wherein the accessory structure allows the first electronic device to be mounted at various angles when the at least one first magnet and the at least one second magnet are attached to/detached from the at least one third magnet and the at least one fourth magnet of the first and second electronic devices by magnetic force and the first and second curved faces of the first and second electronic devices are rotated along the third and fourth curved faces such that the accessory structure is bent by the rotation, wherein the accessory structure includes:
a first cover part located on a portion of a front face of the first electronic device, and including the third curved face formed on one side thereof to face the first curved face, the at least one third magnet located in the third curved face, the fourth curved face formed on another side thereof to face the second curved face, and the at least one fourth magnet located in the fourth curved face; and
a second cover part located on a rear face of the first electronic device, and rotatably connected to the first cover part, the second cover part being bent while being rotated to face a least a portion of the rear face of the first electronic device and to allow the first electronic device to be mounted at the various angles,
wherein the at least one third magnet and the at least one fourth magnet are attached to/detached from the at least one first magnet and the at least one second magnets by magnetic force, and the first and second curved faces of the first and second electronic devices are rotated along the third and fourth curved faces of the first cover part.

2. The electronic device of claim 1, wherein the first electronic device includes at least one of a notebook computer, a netbook, a smartphone, and a tablet PC, and the second electronic device includes a keyboard.

3. The electronic device of claim 1, wherein each of the first, second, third, and fourth magnets has a cylindrical bar shape.

4. The electronic device of claim 3, wherein a first portion of each of the first, second, third, and fourth magnets generates magnetic force, and wherein a second portion of each of the first, second, third, and fourth magnets includes a shield member configured to block the magnetic force of each of the magnets, and
wherein the shield member includes a metal material or a synthetic resin material, which blocks the magnetic force of each of the magnets.

5. The electronic device of claim 3, wherein each of the first, second, third, and fourth curved faces includes at least one of circular, hemisphere, and elliptical shapes in cross section.

6. The electronic device of claim 1, wherein the first cover part includes at least one of a speaker, a microphone, a camera, a connector terminal, a key button, and a touch screen.

7. The electronic device of claim 1, wherein the second cover part includes at least one bent portion that allows the second cover part to be bent.

8. The electronic device of claim 7, wherein, when the second cover part is used or not used as a cradle, the second cover part is attached to/detached from at least one mounting magnet included in the first electronic device.

9. The electronic device of claim 8, wherein each of the first electronic device, the second electronic device, and the first cover part includes a near-field communication module such that the first and second electronic devices and the first cover part transmit and receive a signal for near-field communication with each other.

10. The electronic device of claim 9, wherein, when the second cover part is used as a cradle, the first magnet of the first electronic device is attached to the third magnet of the first cover part, the first curved face of the first electronic device is rotated along the third curved face of the first cover part,
the second cover part is rotated and bent to be attached to the at least one mounting magnet provided on the rear face of the first electronic device, so that the second cover part is used as a cradle, and
the second magnet of the second electronic device is attached to/detached from the fourth magnet of the first cover part.

11. The electronic device of claim 9, wherein, when the first electronic device is mounted at various angles, the first magnet of the first electronic device is separated from the third magnet of the first cover part and is attached to the fourth magnet, the first curved face of the first electronic device is rotated along the fourth curved face of the first cover part,
the second cover part is rotated and bent to be attached to the at least one mounting magnet provided on the rear face of the first electronic device, and the second cover part is located to face at least a portion of the rear face of the first electronic device, so that the second cover part is used as a cradle, and
the second magnet of the second electronic device is attached to/detached from the fourth magnet of the first cover part.

12. The electronic device of claim 1, wherein the first electronic device is configured to perform an input mode or an operation mode by attaching/detaching the at least one first magnet of the first electronic device to/from the at least one third magnet of the accessory structure by magnetic force, and
the second electronic device is configured to perform an input mode or an operation mode by attaching/detaching the at least one second magnet of the second electronic device to/from the at least one fourth magnet of the accessory structure by magnetic force.

13. An accessory for coupling an electronic device, comprising:
a cover part including a first curved face, the cover part configured to cover at least one surface of an electronic device; and
at least one first magnet included in the first curved face of the cover part, the first magnet including a first portion configured to generate magnetic force and a shield member configured to block the generated magnetic force,
wherein the first magnet is configured to couple to a second magnet disposed in the electronic device, such that the electronic device is physically coupled to an input device through the accessory, and
wherein the at least one first magnet includes a cylindrical shape, and the shield member is formed in a corresponding cylindrical shape as to cover a portion of the first magnet, such that the electronic device is shielded from the generated magnetic force while rotatably coupled to the accessory.

14. An electronic device, comprising:
a first curved face and at least one first magnet in the first curved face; and
an accessory structure including a bendable cover, a second curved face with at least one second magnet in the second curved face, and a third curved face with at least one third magnet in the third curved face,
wherein the accessory structure is configured such that:
when the bendable cover is set at a first bending angle, the at least one second magnet is detachably coupled to the at least one first magnet by magnetic force to set the electronic device at a first display angle relative to the accessory structure, and
when the bendable cover is set at a second bending angle different from the first bending angle, the at least one third magnet is detachably coupled to the at least one first magnet by magnetic force to set the electronic device at a second display angle different from the first display angle relative to the accessory structure, and wherein when the accessory structure and the electronic device are coupled at the at least one second magnet, the second curved face is rotatable along the first curved face.

15. The electronic device of claim 14, wherein the accessory structure includes a cover part, which is located on a front face of the electronic device and includes the second curved face facing the first curved face at one side and the at least one second magnet in the second curved face, and wherein the at least one second magnet is attached to/detached from the at least one first magnet by magnetic force, the second curved face of the cover part is rotatable along the first curved face of the electronic device, and the cover part is bent when rotated to face at least a portion of a rear face of the electronic device to allow the electronic device to be mounted at various angles.

16. The electronic device of claim 15, wherein a first portion of the first magnet generates magnetic force and a second portion of the first magnet opposite the first portion of the first magnet includes a shield member configured to block the magnetic force of the first magnet, and a first portion of the second magnet generates magnetic force and a second portion of the second magnet opposite the first portion of the second magnet includes a shield member configured to block the magnetic force of the second magnet.

17. The electronic device of claim 16, wherein the shield member includes a metal material or other material which blocks the magnetic force of each of the magnets.

18. The electronic device of claim 15, wherein the cover part includes at least one of a speaker, a microphone, a camera, a connector terminal, a key button, and a touch screen.

19. The electronic device of claim 15, wherein each of the electronic device and the cover part includes a near-field communication module such that the electronic device and the cover part transmit and receive a signal for near-field communication with each other.

* * * * *